United States Patent
Chakrapani et al.

(10) Patent No.: US 8,252,503 B2
(45) Date of Patent: Aug. 28, 2012

(54) PHOTORESIST COMPOSITIONS

(75) Inventors: Srinivasan Chakrapani, Bridgewater, NJ (US); Munirathna Padmanaban, Bridgewater, NJ (US); Muthiah Thiyagarajan, Bridgewater, NJ (US); Takanori Kudo, Bedminster, NJ (US); David L. Rentkiewicz, North Brunswick, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 721 days.

(21) Appl. No.: 11/844,589

(22) Filed: Aug. 24, 2007

(65) Prior Publication Data

US 2009/0053652 A1 Feb. 26, 2009

(51) Int. Cl.
G03F 7/004 (2006.01)
G03F 7/30 (2006.01)

(52) U.S. Cl. ............ 430/270.1; 430/326; 430/910

(58) Field of Classification Search ........ 430/270.1, 430/326, 910; 526/281, 282
See application file for complete search history.

(56) References Cited

U.S. PATENT DOCUMENTS

| | | | |
|---|---|---|---|
| 4,701,390 A | 10/1987 | Grunwald et al. | |
| 5,019,660 A | 5/1991 | Chapman et al. | |
| 5,736,301 A | 4/1998 | Fahey et al. | |
| 5,837,420 A | 11/1998 | Aoai et al. | |
| 5,910,392 A | 6/1999 | Nozaki et al. | |
| 6,111,143 A | 8/2000 | Park et al. | |
| 6,358,665 B1 | 3/2002 | Pawlowski et al. | |
| 6,447,980 B1 | 9/2002 | Rahman et al. | |
| 6,753,126 B2 | 6/2004 | Park et al. | |
| 6,783,589 B2 | 8/2004 | Dahl et al. | |
| 6,824,956 B2 | 11/2004 | Sato | |
| 7,033,728 B2 | 4/2006 | Dammel | |
| 7,144,675 B2 | 12/2006 | Shima et al. | |
| 7,157,207 B2 * | 1/2007 | Funatsu et al. ............. | 430/270.1 |
| 7,390,613 B1 | 6/2008 | Rahman et al. | |
| 2002/0177743 A1 | 11/2002 | Dahl et al. | |
| 2003/0194640 A1 | 10/2003 | Sato | |
| 2003/0199710 A1 | 10/2003 | Liu et al. | |
| 2003/0235782 A1 | 12/2003 | Padmanaban et al. | |
| 2004/0229155 A1* | 11/2004 | Rahman et al. ............. | 430/270.1 |
| 2005/0074690 A1 | 4/2005 | Liu et al. | |
| 2005/0147915 A1 | 7/2005 | Dammel | |
| 2005/0271974 A1 | 12/2005 | Rahman et al. | |
| 2006/0057496 A1 | 3/2006 | Liu et al. | |
| 2006/0063107 A1 | 3/2006 | Liu et al. | |
| 2006/0217519 A1 | 9/2006 | Benoit et al. | |
| 2007/0015084 A1 | 1/2007 | Rahman et al. | |
| 2007/0031757 A1 | 2/2007 | Kodama et al. | |
| 2007/0054217 A1 | 3/2007 | Kodama et al. | |
| 2007/0072118 A1 | 3/2007 | Nishiyama et al. | |
| 2007/0087288 A1 | 4/2007 | Nishiyama et al. | |
| 2007/0111138 A1 | 5/2007 | Rahman et al. | |
| 2007/0224520 A1 | 9/2007 | Ogata et al. | |
| 2008/0131810 A1* | 6/2008 | Rahman et al. ............. | 430/270.1 |
| 2008/0171270 A1 | 7/2008 | Padmanaban et al. | |

FOREIGN PATENT DOCUMENTS

| | | |
|---|---|---|
| EP | 1 717 261 A1 | 11/2006 |
| EP | 1 736 485 A | 12/2006 |
| EP | 1 736 485 A1 | 12/2006 |
| JP | 2007-72102 A | 3/2007 |
| WO | WO 2005/111097 A1 | 11/2005 |
| WO | WO 2005/123795 A1 | 12/2005 |
| WO | WO 2006/077705 A1 | 7/2006 |

OTHER PUBLICATIONS

Form PCT/IB/326, Form PCT/IB/373, and Form PCT/ISA/237 for PCT/IB2008/000123 dated Jul. 30, 2009 which corresponds to U.S. Appl. No. 11/623,335.
Front page of WO 2005/080473 A1.
Front page of WO 2005/100412 A1.
English Language Abstract of WO 2005/090473 A1.
English Language Abstract of WO 2005/100412 A1.
English Language Abstract of WO 2005/111097 A1.
English Language Abstract of WO 2005/123795 A1.
English Language Abstract of WO 2006/077705 A1.
English Language Abstract of JP 2006-28472 A.
English Language Abstract of JP 2007-72102 A.
Machine Language English Translation from JPO of JP 2006-28472 A.
Notification of Transmittal of the International Search Report and the Written Opinion of the International Searching Authority, or the Declaration (Form PCT/ISA/220), International Search Report (Form PCT/ISA/210 & 206), and Written Opinion of the International Searching Authority (Form PCT/ISA/220) for PCT/IB2004/004384.
"Diamondoid Hydrocarbons—Delving into Nature's Bounty", Alan P. Marchand, Science, vol. 299, Jan. 3, 2003, pp. 52-pp. 53.
"Isolation and Structure of Higher Diamondoids, Nanometer-Sized Diamond Molecules", J. E. Dahl et al., Science, vol. 299, Jan. 3, 2003, pp. 96-pp. 99.
"A Novel Polymer for a 193-nm Resist", Koji Nokaki et al., Journal of Photopolymer Science and Technology, vol. 9, No. 3 (1996), pp. 509-pp. 522.
"Design of cycloolefin-maleic anhydride resist for ArF lithography", Jae-Chang Jung et al., SPIE, vol. 3333 Part 1, Feb. 23-25, 1998, pp. 11-pp. 25.
"Adhesion Characteristics of Alicyclic Polymers for use in ArF Excimer Laser Lithography", Kaichiro Nakano et al., SPIE, vol. 3333, Part 1, Feb. 23-25, 1998, pp. 43-pp. 52.
"Reactive ion etching of 193 nm resist candidates: current platforms, future requirements", T. Wallow et al., SPIE, vol. 3333, Part 1, Feb. 23-25, 1998, pp. 92-pp. 101. Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/000122, which corresponds to this application.
Office Action dated Jun. 19, 209S from USPTO in U.S. Appl. No. 11/623,335.
Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/000123, which corresponds to U.S. Appl. No. 11/623,335.

(Continued)

Primary Examiner — John Chu
(74) Attorney, Agent, or Firm — Alan Kass; Sangya Jain

(57) ABSTRACT

Photoresist compositions are disclosed.

7 Claims, No Drawings

OTHER PUBLICATIONS

Notification of the First Office Action dated Oct. 31, 2011 from the Chinese IPO for Chinese Patent Application No. 200880104250.2, which corresponds to U.S. Appl. No. 11/844,589.

English Translation of Notification of the First Office Action dated Oct. 31, 2011 from the Chinese IPO for Chinese Patent Application No. 200880104250.2, which corresponds to U.S. Appl. No. 11/844,589.

Office Action dated Dec. 10, 2008 from USPTO in U.S. Appl. No. 11/623,335.

Office Action dated Mar. 31, 2009 from USPTO in U.S. Appl. No. 11/623,335.

Office Action dated Nov. 9, 2009 from USPTO in U.S. Appl. No. 11/623,335.

* cited by examiner

PHOTORESIST COMPOSITIONS

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist. The trend toward the miniaturization of semiconductor devices has led to the use of new photoresists that are sensitive at lower and lower wavelengths of radiation and has also led to the use of sophisticated multilevel systems to overcome difficulties associated with such miniaturization.

There are two types of photoresist compositions: negative-working and positive-working. The type of photoresist used at a particular point in lithographic processing is determined by the design of the semiconductor device. When negative-working photoresist compositions are exposed image-wise to radiation, the areas of the photoresist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature, which the resist composition can transfer from the photomask to the substrate with a high degree of image edge acuity after exposure and development. In many leading edge manufacturing applications today, photoresist resolution on the order of less than one-half micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices. In cases where the photoresist dimensions have been reduced to below 150 nanometers (nm), the roughness of the photoresist patterns has become a critical issue. Edge roughness, commonly known as line edge roughness, is typically observed for line and space patterns as roughness along the photoresist line, and for contact holes as side wall roughness. Edge roughness can have adverse effects on the lithographic performance of the photoresist, especially in reducing the critical dimension latitude and also in transferring the line edge roughness of the photoresist to the substrate. Hence, photoresists that minimize edge roughness are highly desirable.

Photoresists sensitive to short wavelengths, between about 100 nm and about 300 nm are often used where subhalfmicron geometries are required.

High resolution, chemically amplified, deep ultraviolet (100 300 nm) positive and negative tone photoresists are available for patterning images with less than quarter micron geometries. To date, there are three major deep ultraviolet (UV) exposure technologies that have provided significant advancement in miniaturization, and these use lasers that emit radiation at 248 nm, 193 nm (dry and immersion) and 157 nm. Photoresists used in the deep UV typically comprise a polymer which has an acid labile group and which can deprotect in the presence of an acid, a photoactive component which generates an acid upon absorption of light, and a solvent.

Photoresists for 248 nm have typically been based on substituted polyhydroxystyrene and its copolymers, such as those described in U.S. Pat. Nos. 4,491,628 and 5,350,660. On the other hand, photoresists for 193 nm exposure require non-aromatic polymers, since aromatics are opaque at this wavelength. U.S. Pat. No. 5,843,624 and GB 2,320,718 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon:hydrogen ratios which improve etch resistance, they also provide transparency at low wavelengths and they have relatively high glass transition temperatures. Photoresists sensitive at 157 nm have been based on fluorinated polymers, which are known to be substantially transparent at that wavelength. Photoresists derived from polymers containing fluorinated groups are described in WO 00/67072 and WO 00/17712.

SUMMARY OF THE INVENTION

A polymer comprising (i) two or more recurring units selected from

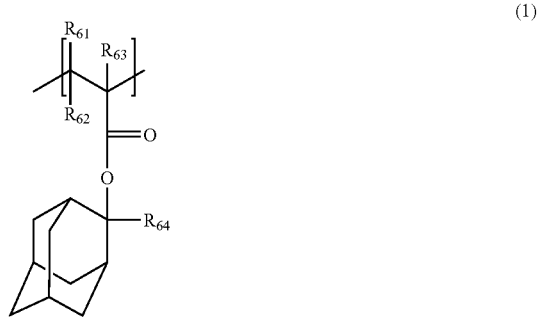

(1)

(2)
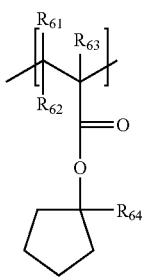
(3)
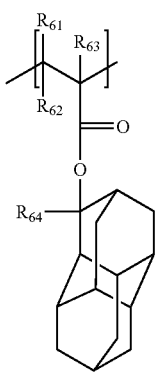
(4)
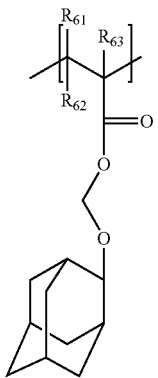
(5)
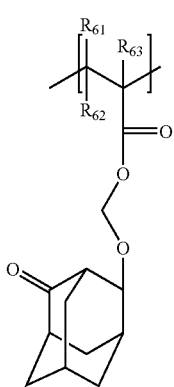
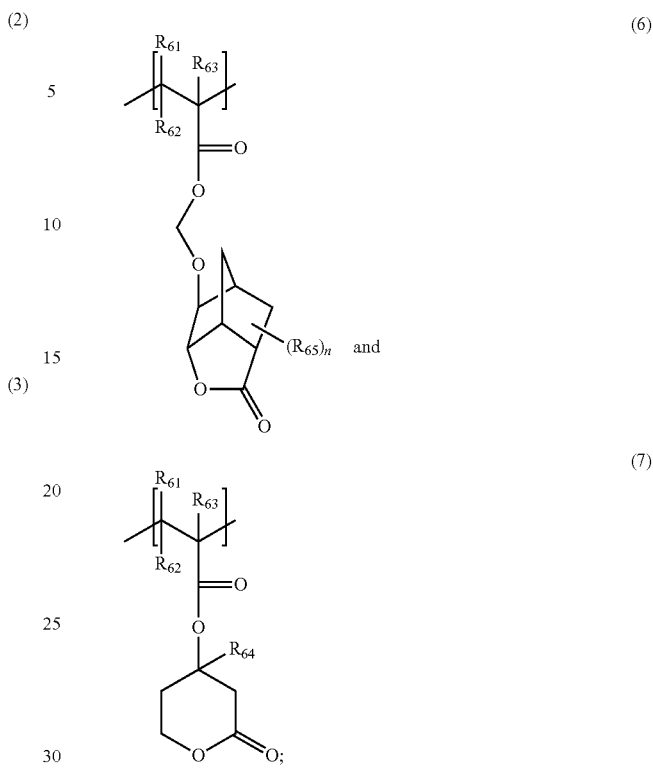
where each of $R_{61}$, $R_{62}$, $R_{63}$, and $R_{65}$ are individually selected from hydrogen or $C_{1-4}$ alkyl; and $R_{64}$ is $C_{1-4}$ alkyl; and
(ii) at least one additional recurring unit selected from
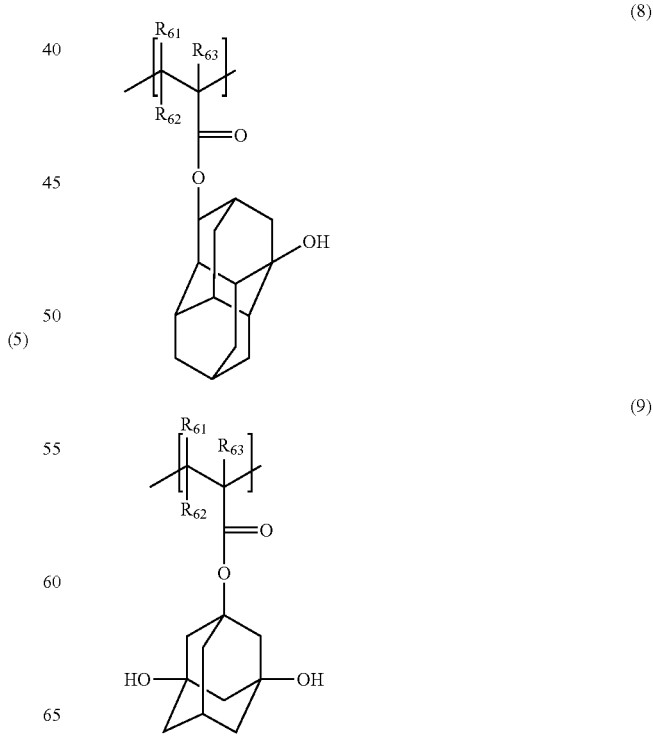

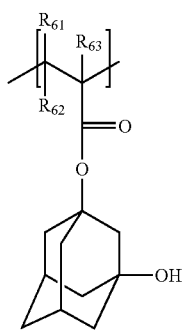
(10)
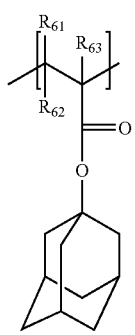
(11)
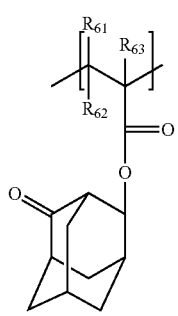
(12)
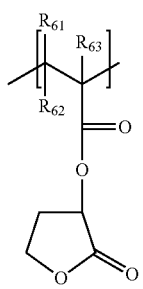
(13)
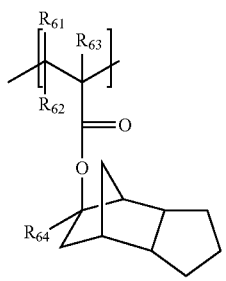
(14)
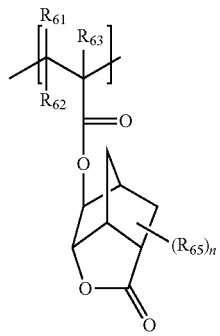
(15)
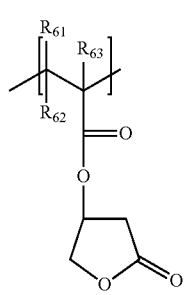
(16)
(17)
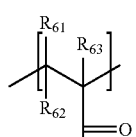
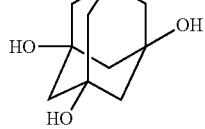
(18)
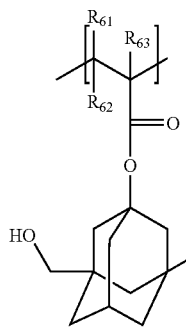
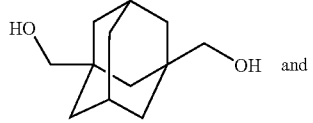 and

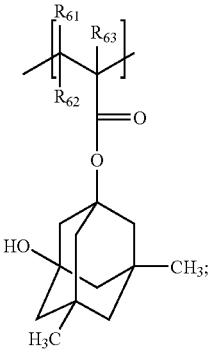

(19)

where each $R_{61}$, $R_{62}$, $R_{63}$, $R_{64}$, and $R_{65}$ are individually selected from hydrogen or $C_{1-4}$ alkyl and n is a number 0 to 3 is disclosed.

For example, the polymer can be one where for (i), the recurring unit is a mixture of the compound of formula (1) where $R_{61}$ and $R_{62}$ are hydrogen, $R_{63}$ is methyl and $R_{64}$ is ethyl and the compound of formula (2) where $R_{61}$ and $R_{62}$ are hydrogen, $R_{63}$ is methyl and $R_{64}$ is ethyl; or the recurring unit is a mixture of the compound of formula (1) where $R_{61}$ and $R_{62}$ are hydrogen, $R_{63}$ is methyl and $R_{64}$ is ethyl and the compound of formula (3) where $R_{61}$ and $R_{62}$ are hydrogen, $R_{63}$ is methyl and $R_{64}$ is ethyl; or the or the recurring unit is a mixture of the compound of formula (1) where $R_{61}$ and $R_{62}$ are hydrogen, $R_{63}$ is methyl and $R_{64}$ is ethyl and the compound of formula (4) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl and the compound of formula (5) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl and the compound of formula (3) where $R_{61}$ and $R_{62}$ are hydrogen, $R_{63}$ is methyl and $R_{64}$ is ethyl; or the recurring unit is a mixture of the compound of formula (2) where $R_{61}$ and $R_{62}$ are hydrogen, $R_{63}$ is methyl and $R_{64}$ is ethyl and the compound of formula (4) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl and the compound of formula (5) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl and the compound of formula (6) where $R_{61}$ and $R_{62}$ are hydrogen, $R_{63}$ is methyl and $R_{65}$ is hydrogen; or the recurring unit is a mixture of the compound of formula (2) where $R_{61}$ and $R_{62}$ are hydrogen, $R_{63}$ is methyl and $R_{64}$ is ethyl and the compound of formula (7) where $R_{61}$ and $R_{62}$ are hydrogen and $R_{63}$ and $R_{64}$ are methyl; or the recurring unit is a mixture of the compound of formula (3) where $R_{61}$ and $R_{62}$ are hydrogen, $R_{63}$ is methyl and $R_{64}$ is ethyl and the compound of formula (4) where $R_{61}$ and $R_{62}$ are hydrogen and $R_{63}$ is methyl; or the recurring unit is a mixture of the compound of formula (3) where $R_{61}$ and $R_{62}$ are hydrogen, $R_{63}$ is methyl and $R_{64}$ is ethyl and the compound of formula (5) where $R_{61}$ and $R_{62}$ are hydrogen and $R_{63}$ is methyl; or the recurring unit is a mixture of the compound of formula (3) where $R_{61}$ and $R_{62}$ are hydrogen, $R_{63}$ is methyl and $R_{64}$ is ethyl and the compound of formula (6) where $R_{61}$ and $R_{62}$ are hydrogen, $R_{63}$ is methyl and $R_{65}$ is hydrogen; or the recurring unit is a mixture of the compound of formula (3) where $R_{61}$ and $R_{62}$ are hydrogen, $R_{63}$ is methyl and $R_{64}$ is ethyl and the compound of formula (7) where $R_{61}$ and $R_{62}$ are hydrogen and $R_{63}$ and $R_{64}$ are methyl; or the recurring unit is a mixture of the compound of formula (4) where $R_{61}$ and $R_{62}$ are hydrogen and $R_{63}$ is methyl and the compound of formula (5) where $R_{61}$ and $R_{62}$ are hydrogen and $R_{63}$ is methyl; or the recurring unit is a mixture of the compound of formula (4) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (4) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (5) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (5) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (6) where $R_{61}$ and $R_{62}$ are hydrogen, $R_{63}$ is methyl and $R_{65}$ is hydrogen and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (3) where $R_{61}$ and $R_{62}$ are hydrogen, $R_{63}$ is methyl and $R_{64}$ is ethyl; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (4) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (5) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (4) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (5) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (5) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (5) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl, the compound of formula (5) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (6) where $R_{61}$ and $R_{62}$ are hydrogen, $R_{63}$ is methyl and $R_{65}$ is hydrogen and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (4) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (5) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (6) where $R_{61}$ and $R_{62}$ are hydrogen, $R_{63}$ is methyl and $R_{65}$ is hydrogen; or the recurring unit is a mixture of the compound of formula (2) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (5) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (2) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl, the compound of formula (5) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (2) where $R_{61}$ and $R_{62}$ are hydrogen, $R_{63}$ is methyl and $R_{64}$ is ethyl, the compound of formula (5) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl, the compound of formula (6) where $R_{61}$ and $R_{62}$ are hydrogen, $R_{63}$ is methyl and $R_{65}$ is hydrogen and the compound of formula (7) where $R_{61}$ and $R_{62}$ are hydrogen and $R_{63}$ and $R_{64}$ are methyl, and mixtures thereof.

Another example is a polymer where for (ii), the additional recurring unit is selected from the compound of formula (8) where $R_{61}$ and $R_{62}$ are hydrogen and $R_{63}$ is methyl; the compound of formula (8) where $R_{61}$, $R_{62}$, and $R_{63}$ are hydrogen; the compound of formula (9) where $R_{61}$ and $R_{62}$ are hydrogen and $R_{63}$ is methyl; the compound of formula (9) where $R_{61}$, $R_{62}$, and $R_{63}$ are hydrogen; the compound of formula (10) where $R_{61}$ and $R_{62}$ are hydrogen and $R_{63}$ is methyl; the compound of formula (10) where $R_{61}$, $R_{62}$, and $R_{63}$ are hydrogen; the compound of formula (11) where $R_{61}$ and $R_{62}$ are hydrogen and $R_{63}$ is methyl; the compound of formula (11) where $R_{61}$, $R_{62}$, and $R_{63}$ are hydrogen; the compound of formula (12) where $R_{61}$ and $R_{62}$ are hydrogen and $R_{63}$ is methyl; the compound of formula (12) where $R_{61}$ and $R_{62}$ are hydrogen; the compound of formula (13) where $R_{61}$ and $R_{62}$ hydrogen and $R_{63}$ is methyl; the compound of formula (13) where $R_{61}$, $R_{62}$, and $R_{63}$ are hydrogen; the compound of formula (14) where $R_{61}$, $R_{62}$, and $R_{64}$ are hydrogen and $R_{63}$ is methyl; the compound of formula (14) where $R_{61}$, $R_{62}$, $R_{63}$, and $R_{64}$ are hydrogen; the compound of formula (15) where $R_{61}$, $R_{62}$, and $R_{65}$ are hydrogen and $R_{63}$ is methyl; the compound of formula (15) where $R_{61}$, $R_{62}$, $R_{63}$, and $R_{65}$ are hydrogen; the compound of formula (16) where $R_{61}$ and $R_{62}$ hydrogen and $R_{63}$ is methyl; the compound of formula (16) where $R_{61}$, $R_{62}$, and $R_{63}$ are hydrogen; the compound of formula (17) where $R_{61}$ and $R_{62}$ hydrogen and $R_{63}$ is methyl; the compound of formula (17) where $R_{61}$, $R_{62}$, and $R_{63}$ are hydrogen; the compound of formula (18) where $R_{61}$ and $R_{62}$ hydrogen and $R_{63}$ is methyl; the compound of formula (18) where $R_{61}$, $R_{62}$, and $R_{63}$ are hydrogen; the compound of formula (19) where $R_{61}$ and $R_{62}$ hydrogen and $R_{63}$ is methyl; the compound of formula (19) where $R_{61}$, $R_{62}$, and $R_{63}$ are hydrogen, and mixtures thereof.

Another example is a polymer where for (ii), the additional recurring unit is selected from the compound of formula (10) where $R_{61}$, $R_{62}$, and $R_{63}$ are hydrogen; the compound of formula (11) where $R_{61}$, $R_{62}$, and $R_{63}$ are hydrogen; the compound of formula (12) where $R_{61}$ and $R_{62}$ are hydrogen and $R_{63}$ is methyl; the compound of formula (13) where $R_{61}$ and $R_{62}$ hydrogen and $R_{63}$ is methyl; the compound of formula (14) where $R_{61}$, $R_{62}$, and $R_{64}$ are hydrogen and $R_{63}$ is methyl; the compound of formula (15) where $R_{61}$, $R_{62}$, $R_{63}$, and $R_{65}$ are hydrogen and mixtures thereof.

Another example is a polymer where for (ii), the additional recurring unit is a mixture of the compound of formula (10) where $R_{61}$, $R_{62}$, and $R_{63}$ are hydrogen and the compound of formula (13) where $R_{61}$ and $R_{62}$ hydrogen and $R_{63}$ is methyl; the compound of formula (10) where $R_{61}$, $R_{62}$, and $R_{63}$ are hydrogen and the compound of formula (15) where $R_{61}$, $R_{62}$, $R_{63}$, and $R_{65}$ are hydrogen; the compound of formula (10) where $R_{61}$, $R_{62}$, and $R_{63}$ are hydrogen, the compound of formula (11) where $R_{61}$, $R_{62}$, and $R_{63}$ are hydrogen and the compound of formula (13) where $R_{61}$ and $R_{62}$ hydrogen and $R_{63}$ is methyl; the compound of formula (10) where $R_{61}$, $R_{62}$, and $R_{63}$ are hydrogen, the compound of formula (12) where $R_{61}$ and $R_{62}$ are hydrogen and $R_{63}$ is methyl and the compound of formula (13) where $R_{61}$ and $R_{62}$ hydrogen and $R_{63}$ is methyl; or the compound of formula (10) where $R_{61}$, $R_{62}$, and $R_{63}$ are hydrogen, the compound of formula (13) where $R_{61}$ and $R_{62}$ hydrogen and $R_{63}$ is methyl and the compound of formula (14) where $R_{61}$, $R_{62}$, and $R_{64}$ are hydrogen and $R_{63}$ is methyl.

Examples of such polymers are set forth below.

In addition, a photoresist composition comprising the above polymer is also disclosed. The photoresist composition can contain at least one photoacid generator and at least one base.

In addition, a process for imaging a photoresist comprising the steps of: a) coating a substrate with the above photoresist composition; b) baking the substrate to substantially remove the solvent; c) image-wise exposing the photoresist coating; d) post-exposure baking the photoresist coating; and e) developing the photoresist coating with an aqueous alkaline solution is also disclosed.

In addition, a method for producing a microelectronic device by forming an image on a substrate comprising: a) the above providing a photoresist composition; b) coating a suitable substrate with the photoresist composition of step a); and c) heat treating the coated substrate of step b) until substantially all of the photoresist solvent is removed; image-wise exposing the photoresist composition and removing the image-wise exposed areas of such composition with a suitable developer is also disclosed.

DETAILED DESCRIPTION OF THE INVENTION

A polymer comprising (i) two or more recurring units selected from

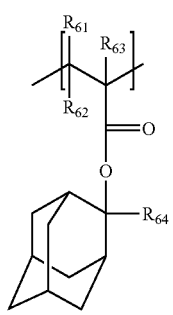
(1)

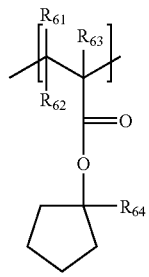
(2)

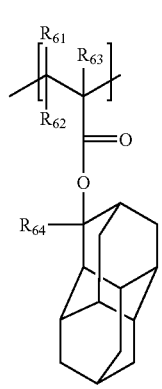
(3)

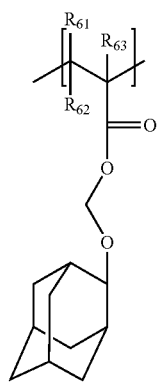
(4)

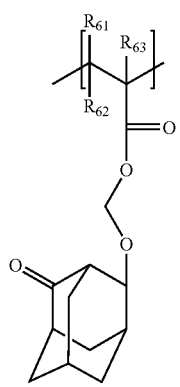
(5)

-continued
(6)
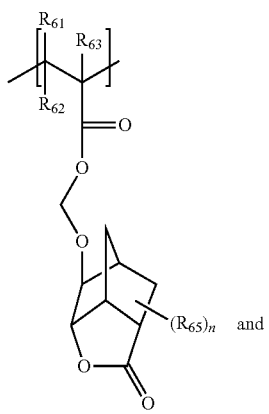 and
(7)
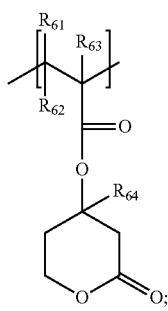
where each of $R_{61}$, $R_{62}$, $R_{63}$, and $R_{65}$ are individually selected from hydrogen or $C_{1-4}$ alkyl; and $R_{64}$ is $C_{1-4}$ alkyl; and
(ii) at least one additional recurring unit selected from
(8)
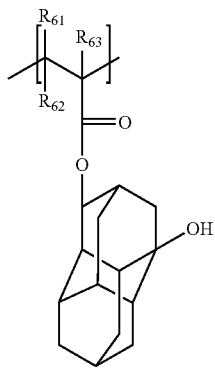
(9)
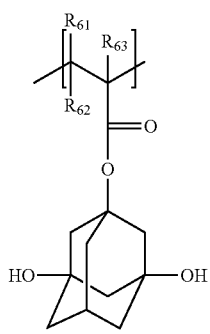
(10)
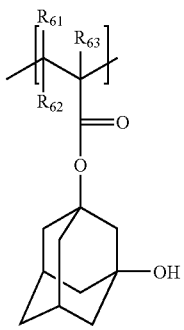
(11)
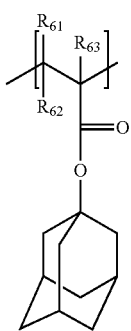
(12)
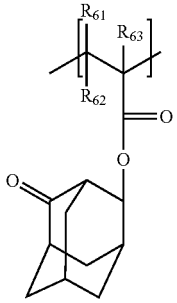
(13)
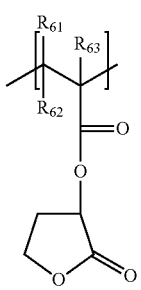
(14)
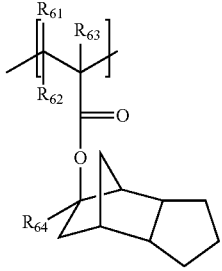

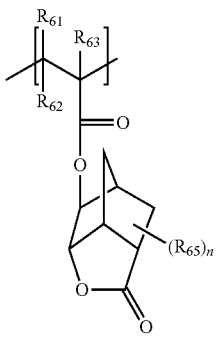

(15)

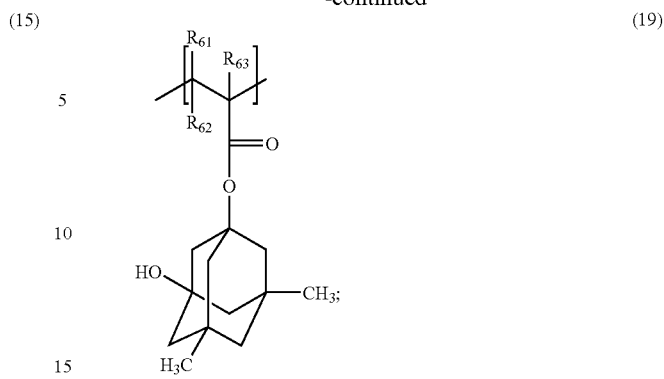

(19)

where each $R_{61}$, $R_{62}$, $R_{63}$, $R_{64}$, and $R_{65}$ are individually selected from hydrogen or $C_{1-4}$ alkyl and n is a number 0 to 3 is disclosed.

For example, the polymer can be one where for (i), the recurring unit is a mixture of the compound of formula (1) where $R_{61}$ and $R_{62}$ are hydrogen, $R_{63}$ is methyl and $R_{64}$ is ethyl and the compound of formula (2) where $R_{61}$ and $R_{62}$ are hydrogen, $R_{63}$ is methyl and $R_{64}$ is ethyl; or the recurring unit is a mixture of the compound of formula (1) where $R_{61}$ and $R_{62}$ are hydrogen, $R_{63}$ is methyl and $R_{64}$ is ethyl and the compound of formula (3) where $R_{61}$ and $R_{62}$ are hydrogen, $R_{63}$ is methyl and $R_{64}$ is ethyl; or the or the recurring unit is a mixture of the compound of formula (1) where $R_{61}$ and $R_{62}$ are hydrogen, $R_{63}$ is methyl and $R_{64}$ is ethyl and the compound of formula (4) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl and the compound of formula (5) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl and the compound of formula (3) where $R_{61}$ and $R_{62}$ are hydrogen, $R_{63}$ is methyl and $R_{64}$ is ethyl; or the recurring unit is a mixture of the compound of formula (2) where $R_{61}$ and $R_{62}$ are hydrogen, $R_{63}$ is methyl and $R_{64}$ is ethyl and the compound of formula (4) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl and the compound of formula (5) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl and the compound of formula (6) where $R_{61}$ and $R_{62}$ are hydrogen, $R_{63}$ is methyl and $R_{65}$ is hydrogen; or the recurring unit is a mixture of the compound of formula (2) where $R_{61}$ and $R_{62}$ are hydrogen, $R_{63}$ is methyl and $R_{64}$ is ethyl and the compound of formula (7) where $R_{61}$ and $R_{62}$ are hydrogen and $R_{63}$ and $R_{64}$ are methyl; or the recurring unit is a mixture of the compound of formula (3) where $R_{61}$ and $R_{62}$ are hydrogen, $R_{63}$ is methyl and $R_{64}$ is ethyl and the compound of formula (4) where $R_{61}$ and $R_{62}$ are hydrogen and $R_{63}$ is methyl; or the recurring unit is a mixture of the compound of formula (3) where $R_{61}$ and $R_{62}$ are hydro- (16)

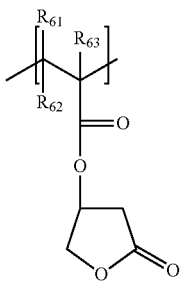

(17)

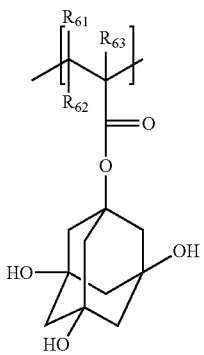

(18)

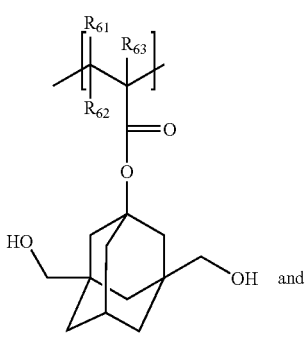

and gen, $R_{63}$ is methyl and $R_{64}$ is ethyl and the compound of formula (5) where $R_{61}$ and $R_{62}$ are hydrogen and $R_{63}$ is methyl; or the recurring unit is a mixture of the compound of formula (3) where $R_{61}$ and $R_{62}$ are hydrogen, $R_{63}$ is methyl and $R_{64}$ is ethyl and the compound of formula (6) where $R_{61}$ and $R_{62}$ are hydrogen, $R_{63}$ is methyl and $R_{65}$ is hydrogen; or the recurring unit is a mixture of the compound of formula (3) where $R_{61}$ and $R_{62}$ are hydrogen, $R_{63}$ is methyl and $R_{64}$ is ethyl and the compound of formula (7) where $R_{61}$ and $R_{62}$ are hydrogen and $R_{63}$ and $R_{64}$ are methyl; or the recurring unit is a mixture of the compound of formula (4) where $R_{61}$ and $R_{62}$ are hydrogen and $R_{63}$ is methyl and the compound of formula (5) where $R_{61}$ and $R_{62}$ are hydrogen and $R_{63}$ is methyl; or the recurring unit is a mixture of the compound of formula (4) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (4) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (5) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (5) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (6) where $R_{61}$ and $R_{62}$ are hydrogen, $R_{63}$ is methyl and $R_{65}$ is hydrogen and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (3) where $R_{61}$ and $R_{62}$ are hydrogen, $R_{63}$ is methyl and $R_{64}$ is ethyl; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (4) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (5) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl, the compound of formula (2) where $R_{61}$ and $R_{62}$ are hydrogen, $R_{63}$ is methyl and $R_{64}$ is ethyl and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (4) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (5) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (5) where $R_{61}$ and $R_{62}$ are hydrogen and $R_{63}$ is methyl; or the recurring unit is a mixture of the compound of formula (1) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (5) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (1) where $R_{61}$ and $R_{62}$ are hydrogen, $R_{63}$ is methyl and $R_{64}$ is ethyl, the compound of formula (5) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (1) where $R_{61}$ and $R_{62}$ are hydrogen, $R_{63}$ is methyl and $R_{64}$ is ethyl, the compound of formula (6) where $R_{61}$ and $R_{62}$ are hydrogen, $R_{63}$ is methyl and $R_{65}$ is hydrogen and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (4) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (5) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (6) where $R_{61}$ and $R_{62}$ are hydrogen, $R_{63}$ is methyl and $R_{65}$ is hydrogen; or the recurring unit is a mixture of the compound of formula (2) where $R_{61}$ and $R_{62}$ are hydrogen, $R_{63}$ is methyl and $R_{64}$ is ethyl, the compound of formula (3) where $R_{61}$ and $R_{62}$ are hydrogen, $R_{63}$ is methyl and $R_{64}$ is ethyl, and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (5) where $R_{61}$ and $R_{62}$ are hydrogen and $R_{63}$ is methyl; or the recurring unit is a mixture of the compound of formula (2) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (2) where $R_{61}$ and $R_{62}$ are hydrogen, $R_{63}$ is methyl and $R_{64}$ is ethyl, the compound of formula (4) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl, the compound of formula (5) where $R_{61}$ and $R_{62}$ are hydrogen and $R_{63}$ is methyl and the compound of formula (6) where $R_{61}$ and $R_{62}$ are hydrogen, $R_{63}$ is methyl and $R_{65}$ is hydrogen; or the recurring unit is a mixture of the compound of formula (2) where $R_{61}$ and $R_{62}$ are hydrogen, $R_{63}$ is methyl and $R_{64}$ is ethyl, the compound of formula (5) where $R_{61}$ and $R_{62}$ are hydrogen and $R_{63}$ is methyl and the compound of formula (7) where $R_{61}$ and $R_{62}$ are hydrogen and $R_{63}$ and $R_{64}$ are methyl; or the recurring unit is a mixture of the compound of formula (2) where $R_{61}$ and $R_{62}$ are hydrogen, $R_{63}$ is methyl and $R_{64}$ is ethyl, the compound of formula (6) where $R_{61}$ and $R_{62}$ are hydrogen, $R_{63}$ is methyl and $R_{65}$ is hydrogen and the compound of formula (7) where $R_{61}$ and $R_{62}$ are hydrogen and $R_{63}$ and $R_{64}$ are methyl, and mixtures thereof.

Another example is a polymer where for (ii), the additional recurring unit is selected from the compound of formula (8) where $R_{61}$ and $R_{62}$ are hydrogen and $R_{63}$ is methyl; the compound of formula (8) where $R_{61}$, $R_{62}$, and $R_{63}$ are hydrogen; the compound of formula (9) where $R_{61}$ and $R_{62}$ are hydrogen and $R_{63}$ is methyl; the compound of formula (9) where $R_{61}$, $R_{62}$, and $R_{63}$ are hydrogen; the compound of formula (10) where $R_{61}$ and $R_{62}$ are hydrogen and $R_{63}$ is methyl; the compound of formula (10) where $R_{61}$, $R_{62}$, and $R_{63}$ are hydrogen; the compound of formula (11) where $R_{61}$ and $R_{62}$ are hydrogen and $R_{63}$ is methyl; the compound of formula (11) where $R_{61}$, $R_{62}$, and $R_{63}$ are hydrogen; the compound of formula (12) where $R_{61}$ and $R_{62}$ are hydrogen and $R_{63}$ is methyl; the compound of formula (12) where $R_{61}$ and $R_{62}$ are hydrogen; the compound of formula (13) where $R_{61}$ and $R_{62}$ hydrogen and $R_{63}$ is methyl; the compound of formula (13) where $R_{61}$, $R_{62}$, and $R_{63}$ are hydrogen; the compound of formula (14) where $R_{61}$, $R_{62}$, and $R_{64}$ are hydrogen and $R_{63}$ is methyl; the compound of formula (14) where $R_{61}$, $R_{62}$, $R_{63}$, and $R_{64}$ are hydrogen; the compound of formula (15) where $R_{61}$, $R_{62}$, and $R_{65}$ are hydrogen and $R_{63}$ is methyl; the compound of formula (15) where $R_{61}$, $R_{62}$, $R_{63}$, and $R_{65}$ are hydrogen; the compound of formula (16) where $R_{61}$ and $R_{62}$ hydrogen and $R_{63}$ is methyl; the compound of formula (16) where $R_{61}$, $R_{62}$, and $R_{63}$ are hydrogen; the compound of formula (17) where $R_{61}$ and $R_{62}$ hydrogen and $R_{63}$ is methyl; the compound of formula (17) where $R_{61}$, $R_{62}$, and $R_{63}$ are hydrogen; the compound of formula (18) where $R_{61}$ and $R_{62}$ hydrogen and $R_{63}$ is methyl; the compound of formula (18) where $R_{61}$, $R_{62}$, and $R_{63}$ are hydrogen; the compound of formula (19) where $R_{61}$ and $R_{62}$ hydrogen and $R_{63}$ is methyl; the compound of formula (19) where $R_{61}$, $R_{62}$, and $R_{63}$ are hydrogen, and mixtures thereof.

Another example is a polymer where for (ii), the additional recurring unit is selected from the compound of formula (10) where $R_{61}$, $R_{62}$, and $R_{63}$ are hydrogen; the compound of formula (11) where $R_{61}$, $R_{62}$, and $R_{63}$ are hydrogen; the compound of formula (12) where $R_{61}$ and $R_{62}$ are hydrogen and $R_{63}$ is methyl; the compound of formula (13) where $R_{61}$ and $R_{62}$ hydrogen and $R_{63}$ is methyl; the compound of formula (14) where $R_{61}$, $R_{62}$, and $R_{64}$ are hydrogen and $R_{63}$ is methyl; the compound of formula (15) where $R_{61}$, $R_{62}$, $R_{63}$, and $R_{65}$ are hydrogen and mixtures thereof.

Another example is a polymer where for (ii), the additional recurring unit is a mixture of the compound of formula (10) where $R_{61}$, $R_{62}$, and $R_{63}$ are hydrogen and the compound of formula (13) where $R_{61}$ and $R_{62}$ hydrogen and $R_{63}$ is methyl; the compound of formula (10) where $R_{61}$, $R_{62}$, and $R_{63}$ are hydrogen and the compound of formula (15) where $R_{61}$, $R_{62}$, $R_{63}$, and $R_{65}$ are hydrogen; the compound of formula (10) where $R_{61}$, $R_{62}$, and $R_{63}$ are hydrogen, the compound of formula (11) where $R_{61}$, $R_{62}$, and $R_{63}$ are hydrogen and the compound of formula (13) where $R_{61}$ and $R_{62}$ hydrogen and $R_{63}$ is methyl; the compound of formula (10) where $R_{61}$, $R_{62}$, and $R_{63}$ are hydrogen, the compound of formula (12) where $R_{61}$ and $R_{62}$ are hydrogen and $R_{63}$ is methyl and the compound of formula (13) where $R_{61}$ and $R_{62}$ hydrogen and $R_{63}$ is methyl; or the compound of formula (10) where $R_{61}$, $R_{62}$, and $R_{63}$ are hydrogen, the compound of formula (13) where $R_{61}$ and $R_{62}$ hydrogen and $R_{63}$ is methyl and the compound of formula (14) where $R_{61}$, $R_{62}$, and $R_{64}$ are hydrogen and $R_{63}$ is methyl.

Examples of such polymers include poly(2-ethyl-2-adamantyl methacrylate-co-hydroxy-1-adamantyl acrylate-co-α-gamma-butyrolactone methacrylate-co-2-adamantyl methacrylate), poly(2-methyl-2-adamantyl methacrylate-co-5-methacryloyloxy-2,6-norbornanecarbolactone-co-β-gamma-butyrolactone methacrylate), poly(2-ethyl-2-adamantyl methacrylate-co-ethylcyclopentylmethacrylate-co-hydroxy-1-adamantyl acrylate-co-α-gamma-butyrolactone methacrylate), poly(2-ethyl-2-adamantyl methacrylate-co-ethylcyclopentylmethacrylate-co-2-adamantyloxymethyl methacrylate-co-hydroxy-1-adamantyl acrylate-co-α-gamma-butyrolactone methacrylate), poly(2-ethyl-2-adamantyl methacrylate-co-ethylcyclopentylmethacrylate-co-hydroxy-1-adamantyl acrylate-co-α-gamma-butyrolactone methacrylate-co-2-oxoadamantyl methacrylate), poly(2-ethyl-2-adamantyl methacrylate-co-2-adamantyloxymethyl methacrylate-co-hydroxy-1-adamantyl acrylate-co-α-gamma-butyrolactone methacrylate-co-2-adamantyl methacrylate), poly(2-ethyl-2-adamantyl methacrylate-co-2-adamantyloxymethyl methacrylate-co-hydroxy-1-adamantyl acrylate-co-α-gamma-butyrolactone methacrylate), poly(ethylcyclopentylmethacrylate-co-2-adamantyloxymethyl methacrylate-co-hydroxy-1-adamantyl acrylate-co-α-gamma-butyrolactone methacrylate), poly(2-ethyl-2-adamantyl methacrylate-co-hydroxy-1-adamantyl acrylate-co-α-gamma-butyrolactone methacrylate-co-tricyclo[5,2,1,0$^{2,6}$]deca-8-yl methacrylate), poly(2-ethyl-2-adamantyl methacrylate-co-ethylcyclopentylmethacrylate-co-hydroxy-1-adamantyl acrylate-co-5-acryloyloxy-2,6-norbornanecarbolactone), poly(2-ethyl-2-adamantyl methacrylate-co-hydroxy-1-adamantyl acrylate-co-β-gamma-butyrolactone methacrylate-co-2-adamantyl methacrylate), poly(2-ethyl-2-adamantyl methacrylate-co-ethylcyclopentylmethacrylate-co-hydroxy-1-adamantyl acrylate-co-β-gamma-butyrolactone methacrylate), poly(2-ethyl-2-adamantyl methacrylate-co-ethylcyclopentylmethacrylate-co-2-adamantyloxymethyl methacrylate-co-hydroxy-1-adamantyl acrylate-co-β-gamma-butyrolactone methacrylate), poly(2-ethyl-2-adamantyl methacrylate-co-ethylcyclopentylmethacrylate-co-hydroxy-1-adamantyl acrylate-co-β-gamma-butyrolactone methacrylate-co-2-oxoadamantyl methacrylate), poly(2-ethyl-2-adamantyl methacrylate-co-2-adamantyloxymethyl methacrylate-co-hydroxy-1-adamantyl acrylate-co-β-gamma-butyrolactone methacrylate-co-2-adamantyl methacrylate), poly(2-ethyl-2-adamantyl methacrylate-co-2-adamantyloxymethyl methacrylate-co-hydroxy-1-adamantyl acrylate-co-β-gamma-butyrolactone methacrylate), poly(ethylcyclopentylmethacrylate-co-2-adamantyloxymethyl methacrylate-co-hydroxy-1-adamantyl acrylate-co-β-gamma-butyrolactone methacrylate), poly(2-ethyl-2-adamantyl methacrylate-co-hydroxy-1-adamantyl acrylate-co-β-gamma-butyrolactone methacrylate-co-tricyclo[5,2,1,0$^{2,6}$] deca-8-yl methacrylate), poly(2-ethyl-2-diamantylmethacrylate-co-2-oxoadamantyl methacrylate-co-hydroxy-1-adamantyl acrylate-co-α-gamma-butyrolactone methacrylate-co-2-adamantyl methacrylate), poly(2-ethyl-2-diamantylmethacrylate-co-2-oxoadamantyl methacrylate-co-hydroxy-1-adamantyl acrylate-co-α-gamma-butyrolactone methacrylate), poly(2-ethyl-2-diamantylmethacrylate-co-ethylcyclopentylmethacrylate-co-2-oxoadamantyl methacrylate-co-hydroxy-1-adamantyl acrylate-co-α-gamma-butyrolactone methacrylate), poly(2-ethyl-2-diamantylmethacrylate-co-ethylcyclopentylmethacrylate-co-hydroxy-1-adamantyl acrylate-co-α-gamma-butyrolactone methacrylate), poly(2-ethyl-2-diamantylmethacrylate-co-ethylcyclopentylmethacrylate-co-hydroxy-1-adamantyl acrylate-co-2-oxoadamantyl methacrylate), poly(2-ethyl-2-diamantylmethacrylate-co-ethylcyclopentylmethacrylate-co-hydroxy-1-adamantyl acrylate-co-5-acryloyloxy-2,6-norbornanecarbolactone), poly(2-ethyl-2-diamantylmethacrylate-co-hydroxy-1-adamantyl acrylate-co-α-gamma-butyrolactone methacrylate-co-2-adamantyl methacrylate), poly(2-ethyl-2-diamantylmethacrylate-co-hydroxy-1-adamantyl acrylate-co-α-gamma-butyrolactone methacrylate-co-tricyclo[5,2,1,02,6] deca-8-yl methacrylate), poly(2-ethyl-2-adamantyl methacrylate-co-2-ethyl-2-diamantylmethacrylate-co-2-oxoadamantyl methacrylate-co-hydroxy-1-adamantyl acrylate-co-α-gamma-butyrolactone methacrylate), poly(2-ethyl-2-adamantyl methacrylate-co-2-ethyl-2-diamantylmethacrylate-co-hydroxy-1-adamantyl acrylate-co-α-gamma-butyrolactone methacrylate), poly(2-ethyl-2-adamantyl methacrylate-co-2-ethyl-2-diamantylmethacrylate-co-hydroxy-1-adamantyl acrylate-co-α-gamma-butyrolactone methacrylate-co-2-oxoadamantyl methacrylate), poly(2-ethyl-2-adamantyl methacrylate-co-2-ethyl-2-diamantylmethacrylate-co-hydroxy-1-adamantyl acrylate-co-5-acryloyloxy-2,6-norbornanecarbolactone), poly(2-ethyl-2-diamantylmethacrylate-co-2-oxoadamantyl methacrylate-co-hydroxy-1-adamantyl acrylate-co-α-gamma-butyrolactone methacrylate), poly(2-ethyl-2-adamantyl methacrylate-co-ethylcyclopentylmethacrylate-co-2-ethyl-2-diamantylmethacrylate-co-2-oxoadamantyl methacrylate-co-hydroxy-1-adamantyl acrylate-co-α-gamma-butyrolactone methacrylate), poly(2-ethyl-2-adamantyl methacrylate-co-ethylcyclopentylmethacrylate-co-2-ethyl-2-diamantylmethacrylate-co-hydroxy-1-adamantyl acrylate-co-α-gamma-butyrolactone methacrylate), poly(2-ethyl-2-adamantyl methacrylate-co-ethylcyclopentylmethacrylate-co-2-ethyl-2-diamantylmethacrylate-co-hydroxy-1-adamantyl acrylate-co-5-acryloyloxy-2,6-norbornanecarbolactone), poly(2-ethyl-2-adamantyl methacrylate-co-2-oxoadamantyl methacrylate-co-hydroxy-1-adamantyl acrylate-co-α-gamma-butyrolactone methacrylate-co-2-adamantyl methacrylate), poly(2-ethyl-2-adamantyl methacrylate-co-2-ethyl-2-diamantylmethacrylate-co-2-oxoadamantyl methacrylate-co-hydroxy-1-adamantyl acrylate-co-α-gamma-butyrolactone methacrylate), poly(2-ethyl-2-adamantyl methacrylate-co-2-ethyl-2-diamantylmethacrylate-co-hydroxy-1-adamantyl acrylate-co-α-gamma-butyrolactone methacrylate-co-2-adamantyl methacrylate), poly(2-ethyl-2-adamantyl methacrylate-co-2-ethyl-2-diamantylmethacrylate-co-hydroxy-1-adamantyl acrylate-co-α-gamma-butyrolactone methacrylate-co-tricyclo[5,2,1,02,6]deca-8-yl methacrylate), poly(ethylcyclopentylmethacrylate-co-2-ethyl-2-diamantylmethacrylate-co-2-oxoadamantyl methacrylate-co-hydroxy-1-adamantyl acrylate-co-α-gamma-butyrolactone methacrylate), poly(2-ethyl-2-diamantylmethacrylate-co-2-oxoadamantyl methacrylate-co-hydroxy-1-adamantyl acrylate-co-β-gamma-butyrolactone methacrylate-co-2-adamantyl methacrylate), poly(2-ethyl-2-diamantylmethacrylate-co-2-oxoadamantyl methacrylate-co-hydroxy-1-adamantyl acrylate-co-α-gamma-butyrolactone methacrylate), poly(2-ethyl-2-diamantylmethacrylate-co-ethylcyclopentyl-methacrylate-co-2-oxoadamantyl methacrylate-co-hydroxy-1-adamantyl acrylate-co-β-gamma-butyrolactone methacrylate), poly(2-ethyl-2-diamantylmethacrylate-co-ethylcyclopentylmethacrylate-co-hydroxy-1-adamantyl acrylate-co-β-gamma-butyrolactone methacrylate), poly(2-ethyl-2-diamantylmethacrylate-co-ethylcyclopentyl-methacrylate-co-hydroxy-1-adamantyl acrylate-co-β-gamma-butyrolactone methacrylate-co-2-oxoadamantyl methacrylate), poly(2-ethyl-2-diamantylmethacrylate-co-ethylcyclopentylmethacrylate-co-hydroxy-1-adamantyl acrylate-co-5-acryloyloxy-2,6-norbornanecarbolactone), poly(2-ethyl-2-diamantylmethacrylate-co-hydroxy-1-adamantyl acrylate-co-β-gamma-butyrolactone methacrylate-co-2-adamantyl methacrylate), poly(2-ethyl-2-diamantyl-methacrylate-co-hydroxy-1-adamantyl acrylate-co-β-gamma-butyrolactone methacrylate-co-tricyclo[5,2,1,02,6] deca-8-yl methacrylate), poly(2-ethyl-2-adamantyl methacrylate-co-2-ethyl-2-diamantylmethacrylate-co-2-oxoadamantyl methacrylate-co-hydroxy-1-adamantyl acrylate-co-β-gamma-butyrolactone methacrylate), poly(2-ethyl-2-adamantyl methacrylate-co-2-ethyl-2-diamantylmethacrylate-co-hydroxy-1-adamantyl acrylate-co-β-gamma-butyrolactone methacrylate), poly(2-ethyl-2-adamantyl methacrylate-co-2-ethyl-2-diamantylmethacrylate-co-hydroxy-1-adamantyl acrylate-co-β-gamma-butyrolactone methacrylate-co-2-oxoadamantyl methacrylate), poly(2-ethyl-2-adamantyl methacrylate-co-2-ethyl-2-diamantylmethacrylate-co-hydroxy-1-adamantyl acrylate-co-5-acryloyloxy-2,6-norbornanecarbolactone), poly(2-ethyl-2-diamantylmethacrylate-co-2-oxoadamantyl methacrylate-co-hydroxy-1-adamantyl acrylate-co-β-gamma-butyrolactone methacrylate), poly(2-ethyl-2-adamantyl methacrylate-co-ethylcyclopentyl-methacrylate-co-2-ethyl-2-diamantylmethacrylate-co-2-oxoadamantyl methacrylate-co-hydroxy-1-adamantyl acrylate-co-β-gamma-butyrolactone methacrylate), poly(2-ethyl-2-adamantyl methacrylate-co-ethylcyclopentyl-methacrylate-co-2-ethyl-2-diamantylmethacrylate-co-hydroxy-1-adamantyl acrylate-co-β-gamma-butyrolactone methacrylate), poly(2-ethyl-2-adamantyl methacrylate-co-ethylcyclopentylmethacrylate-co-2-ethyl-2-diamantyl-methacrylate-co-hydroxy-1-adamantyl acrylate-co-β-gamma-butyrolactone methacrylate-co-2-oxoadamantyl methacrylate), poly(2-ethyl-2-adamantyl methacrylate-co-ethylcyclopentylmethacrylate-co-2-ethyl-2-diamantyl-methacrylate-co-hydroxy-1-adamantyl acrylate-co-5-acryloyloxy-2,6-norbornanecarbolactone), poly(2-ethyl-2- adamantyl methacrylate-co-2-ethyl-2-diamantylmethacrylate-co-2-oxoadamantyl methacrylate-co-hydroxy-1-adamantyl acrylate-co-β-gamma-butyrolactone methacrylate-co-2-adamantyl methacrylate), poly(2-ethyl-2-adamantyl methacrylate-co-2-ethyl-2-diamantylmethacrylate-co-2-oxoadamantyl methacrylate-co-hydroxy-1-adamantyl acrylate-co-β-gamma-butyrolactone methacrylate), poly(2-ethyl-2-adamantyl methacrylate-co-2-ethyl-2-diamantylmethacrylate-co-hydroxy-1-adamantyl acrylate-co-β-gamma-butyrolactone methacrylate-co-2-adamantyl methacrylate), poly(2-ethyl-2-adamantyl methacrylate-co-2-ethyl-2-diamantylmethacrylate-co-hydroxy-1-adamantyl acrylate-co-β-gamma-butyrolactone methacrylate-co-tricyclo[5,2,1,02,6]deca-8-yl methacrylate), poly(ethylcyclopentylmethacrylate-co-2-ethyl-2-diamantylmethacrylate-co-2-oxoadamantyl methacrylate-co-hydroxy-1-adamantyl acrylate-co-β-gamma-butyrolactone methacrylate, poly(2-ethyl-2-diamantylmethacrylate-co-ethylcyclopentylmethacrylate-co-2-adamantyloxymethyl methacrylate-co-hydroxy-1-adamantyl acrylate-co-α-gamma-butyrolactone methacrylate), poly(2-ethyl-2-diamantylmethacrylate-co-2-adamantyloxymethyl methacrylate-co-hydroxy-1-adamantyl acrylate-co-α-gamma-butyrolactone methacrylate-co-2-adamantyl methacrylate), poly(2-ethyl-2-diamantylmethacrylate-co-2-adamantyloxymethyl methacrylate-co-hydroxy-1-adamantyl acrylate-co-α-gamma-butyrolactone methacrylate), poly(2-ethyl-2-diamantylmethacrylate-co-2-adamantyloxymethyl methacrylate-co-hydroxy-1-adamantyl acrylate-co-α-gamma-butyrolactone methacrylate), poly(2-ethyl-2-diamantylmethacrylate-co-ethylcyclopentylmethacrylate-co-2-adamantyloxymethyl methacrylate-co-hydroxy-1-adamantyl acrylate-co-β-gamma-butyrolactone methacrylate), poly(2-ethyl-2-diamantylmethacrylate-co-2-adamantyloxymethyl methacrylate-co-hydroxy-1-adamantyl acrylate-co-β-gamma-butyrolactone methacrylate-co-2-adamantyl methacrylate), poly(2-ethyl-2-diamantylmethacrylate-co-2-adamantyloxymethyl methacrylate-co-hydroxy-1-adamantyl acrylate-co-β-gamma-butyrolactone methacrylate), poly(2-ethyl-2-diamantylmethacrylate-co-2-adamantyloxymethyl methacrylate-co-hydroxy-1-adamantyl acrylate-co-β-gamma-butyrolactone methacrylate), poly(2-ethyl-2-adamantyl methacrylate-co-ethylcyclopentylmethacrylate-co-2-adamantyloxymethyl methacrylate-co-hydroxy-1-adamantyl acrylate-co-α-gamma-butyrolactone methacrylate), poly(2-ethyl-2-adamantyl methacrylate-co-2-ethyl-2-diamantylmethacrylate-co-2-adamantyloxymethyl methacrylate-co-hydroxy-1-adamantyl acrylate-co-α-gamma-butyrolactone methacrylate-co-2-adamantyl methacrylate), poly(2-ethyl-2-adamantyl methacrylate-co-2-ethyl-2-diamantylmethacrylate-co-2-adamantyloxymethyl methacrylate-co-hydroxy-1-adamantyl acrylate-co-α-gamma-butyrolactone methacrylate), poly(ethylcyclopentylmethacrylate-co-2-ethyl-2-diamantylmethacrylate-co-2-adamantyloxymethyl methacrylate-co-hydroxy-1-adamantyl acrylate-co-α-gamma-butyrolactone methacrylate), poly(2-ethyl-2-adamantyl methacrylate-co-2-ethyl-2-diamantylmethacrylate-co-ethylcyclopentylmethacrylate-co-2-adamantyloxymethyl methacrylate-co-hydroxy-1-adamantyl acrylate-co-β-gamma-butyrolactone methacrylate), poly(2-ethyl-2-adamantyl methacrylate-co-2-ethyl-2-diamantylmethacrylate-co-2-adamantyloxymethyl methacrylate-co-hydroxy-1-adamantyl acrylate-co-β-gamma-butyrolactone methacrylate-co-2-adamantyl methacrylate), poly(2-ethyl-2-adamantyl methacrylate-co-2-ethyl-2-diamantylmethacrylate-co-2-adamantyloxymethyl methacrylate-co-hydroxy-1-adamantyl acrylate-co-β-gamma-butyrolactone methacrylate), poly(ethylcyclopentylmethacrylate-co-2-ethyl-2-diamantylmethacrylate-co-2-adamantyloxymethyl methacrylate-co-hydroxy-1-adamantyl acrylate-co-β-gamma-butyrolactone methacrylate), and the like.

In general, recurring unit (i) will comprise about 25 to about 50 mole percent of the entire polymer, even still from about 35 to about 50 mole percent (based on monomer feeds that make up recurring unit (i) of from about 25 to about 45 mole percent). In some instances, the recurring unit (ii) will contain α-gamma-butyrolactone methacrylate and/or β-gamma-butyrolactone methacrylate. For the entire polymer, the amount of α-gamma-butyrolactone methacrylate and/or β-gamma-butyrolactone methacrylate will range from about 35 to about 55 mole percent and further in some instances, range from about 40 to about 50 mole percent.

In addition, a photoresist composition comprising the above polymer is also disclosed. The photoresist composition can contain at least one photoacid generator and at least one base.

In addition, a process for imaging a photoresist comprising the steps of: a) coating a substrate with the above photoresist composition; b) baking the substrate to substantially remove the solvent; c) image-wise exposing the photoresist coating; d) post-exposure baking the photoresist coating; and e) developing the photoresist coating with an aqueous alkaline solution is also disclosed.

In addition, a method for producing a microelectronic device by forming an image on a substrate comprising: a) the above providing a photoresist composition; b) coating a suitable substrate with the photoresist composition of step a); and c) heat treating the coated substrate of step b) until substantially all of the photoresist solvent is removed; image-wise exposing the photoresist composition and removing the image-wise exposed areas of such composition with a suitable developer is also disclosed.

The composition contains, along with the polymer, a mixture of photoacid generators, which are selected from (i) a compound of formula (Ai)$_2$Xi1, where each Ai is individually an organic onium cation selected from

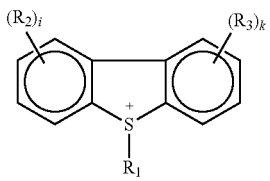

and

Y—Ar where Ar is selected from

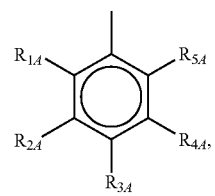

naphthyl, or anthryl;

Y is selected from

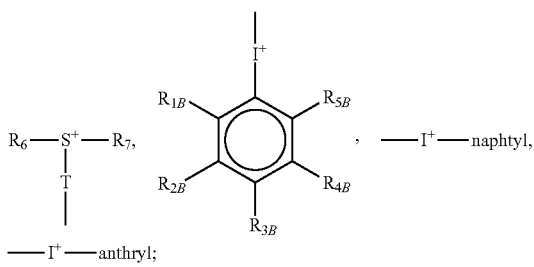

where $R_1$, $R_2$, $R_3$, $R_{1A}$, $R_{1B}$, $R_{2A}$, $R_{2B}$, $R_{3A}$, $R_{3B}$, $R_{4A}$, $R_{4B}$, $R_{5A}$, and $R_{5B}$ are each independently selected from Z, hydrogen, $OSO_2R_9$, $OR_{20}$, straight or branched alkyl chain optionally containing one or more O atoms, monocycloalkyl or polycycloalkyl group optionally containing one or more O atoms, monocycloalkyl- or polycycloalkylcarbonyl group, aryl, aralkyl, arylcarbonylmethyl group, alkoxyalkyl, alkoxycarbonylalkyl, alkylcarbonyl, monocycloalkyl- or polycycloalkyloxycarbonylalkyl with the cycloalkyl ring optionally containing one or more O atoms, monocycloalkyl- or polycycloalkyloxyalkyl with the cycloalkyl ring optionally containing one or more O atoms, straight or branched perfluoroalkyl, monocycloperfluoroalkyl or polycycloperfluoroalkyl, straight or branched alkoxy chain, nitro, cyano, halogen, carboxyl, hydroxyl, sulfate, tresyl, or hydroxyl;

$R_6$ and $R_7$ are each independently selected from straight or branched alkyl chain optionally containing one or more O atoms, monocycloalkyl or polycycloalkyl group optionally containing one or more O atoms, monocycloalkyl- or polycycloalkylcarbonyl group, aryl, aralkyl, straight or branched perfluoroalkyl, monocycloperfluoroalkyl or polycycloperfluoroalkyl, arylcarbonylmethyl group, nitro, cyano, or hydroxyl or $R_6$ and $R_7$ together with the S atom to which they are attached form a 5-, 6-, or 7-membered saturated or unsaturated ring optionally containing one or more O atoms;

$R_9$ is selected from alkyl, fluoroalkyl, perfluoroalkyl, aryl, fluoroaryl, perfluoroaryl, monocycloalkyl or polycycloalkyl group with the cycloalkyl ring optionally containing one or more O atoms, monocyclofluoroalkyl or polycyclofluoroalkyl group with the cycloalkyl ring optionally containing one or more O atoms, or monocycloperfluoralkyl or polycycloperfluoroalkyl group with the cycloalkyl ring optionally containing one or more O atoms;

$R_{20}$ is alkoxyalkyl, alkoxycarbonylalkyl, alkylcarbonyl, monocycloalkyl- or polycycloalkyloxycarbonylalkyl with the cycloalkyl ring optionally containing one or more O atoms, or monocycloalkyl- or polycycloalkyloxyalkyl with the cycloalkyl ring optionally containing one or more O atoms;

T is a direct bond, a divalent straight or branched alkyl group optionally containing one or more O atoms, divalent aryl group, divalent aralkyl group, or divalent monocycloalkyl or polycycloalkyl group optionally containing one or more O atoms;

Z is $-(V)_j-(C(X11)(X12))_n-O-C(=O)-R_8$, where either (i) one of X11 or X12 is straight or branched alkyl chain containing at least one fluorine atom and the other is hydrogen, halogen, or straight or branched alkyl chain or (ii) both of X11 and X12 are straight or branched alkyl chain containing at least one fluorine atom;

V is a linkage group selected from a direct bond, a divalent straight or branched alkyl group optionally containing one or more O atoms, divalent aryl group, divalent aralkyl group, or divalent monocycloalkyl or polycycloalkyl group optionally containing one or more O atoms;

X2 is hydrogen, halogen, or straight or branched alkyl chain optionally containing one or more O atoms;

$R_8$ is a straight or branched alkyl chain optionally containing one or more O atoms, a monocycloalkyl or polycycloalkyl group optionally containing one or more O atoms, or aryl;

X3 is hydrogen, straight or branched alkyl chain, halogen, cyano, or $-C(=O)-R_{50}$ where $R_{50}$ is selected from straight or branched alkyl chain optionally containing one or more O atoms or $-O-R_{51}$ where $R_{51}$ is hydrogen or straight or branched alkyl chain;

each of i and k are independently 0 or a positive integer;

j is 0 to 10;

m is 0 to 10;

and n is 0 to 10, the straight or branched alkyl chain optionally containing one or more O atoms, straight or branched alkyl chain, straight or branched alkoxy chain, monocycloalkyl or polycycloalkyl group optionally containing one or more O atoms, monocycloalkyl- or polycycloalkylcarbonyl group, alkoxyalkyl, alkoxycarbonylalkyl, alkylcarbonyl, monocycloalkyl- or polycycloalkyloxycarbonylalkyl with the cycloalkyl ring optionally containing one or more O atoms, monocycloalkyl- or polycycloalkyloxyalkyl with the cycloalkyl ring optionally containing one or more O atoms, aralkyl, aryl, naphthyl, anthryl, 5-, 6-, or 7-membered saturated or unsaturated ring optionally containing one or more O atoms, or arylcarbonylmethyl group being unsubstituted or substituted by one or more groups selected from the group consisting of Z, halogen, alkyl, $C_{1-8}$ perfluoroalkyl, monocycloalkyl or polycycloalkyl, $OR_{20}$, alkoxy, $C_{3-20}$ cyclic alkoxy, dialkylamino, dicyclic dialkylamino, hydroxyl, cyano, nitro, tresyl, oxo, aryl, aralkyl, oxygen atom, $CF_3SO_3$, aryloxy, arylthio, and groups of formulae (II) to (VI):

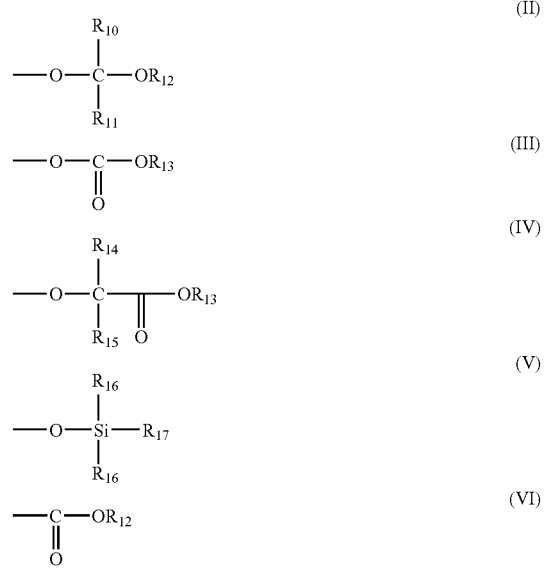

wherein $R_{10}$ and $R_{11}$ each independently represent a hydrogen atom, a straight or branched alkyl chain optionally containing one or more O atoms, or a monocycloalkyl or polycycloalkyl group optionally containing one or more O atoms, or $R_{10}$ and $R_{11}$ together can represent an alkylene group to form a five- or six-membered ring;

$R_{12}$ represents a straight or branched alkyl chain optionally containing one or more O atoms, a monocycloalkyl or polycycloalkyl group optionally containing one or more O atoms, or aralkyl, or $R_{10}$ and $R_{12}$ together represent an alkylene group which forms a five- or six-membered ring together with the interposing —C—O— group, the carbon atom in the ring being optionally substituted by an oxygen atom;

$R_{13}$ represents a straight or branched alkyl chain optionally containing one or more O atoms or a monocycloalkyl or polycycloalkyl group optionally containing one or more O atoms;

$R_{14}$ and $R_{15}$ each independently represent a hydrogen atom, a straight or branched alkyl chain optionally containing one or more O atoms or a monocycloalkyl or polycycloalkyl group optionally containing one or more O atoms;

$R_{16}$ represents a straight or branched alkyl chain optionally containing one or more O atoms, a monocycloalkyl or polycycloalkyl group optionally containing one or more O atoms, aryl, or aralkyl; and $R_{17}$ represents straight or branched alkyl chain optionally containing one or more O atoms, a monocycloalkyl or polycycloalkyl group optionally containing one or more O atoms, aryl, aralkyl, the group —Si($R_{16})_2R_{17}$, or the group —O—Si($R_{16})_2R_{17}$, the straight or branched alkyl chain optionally containing one or more O atoms, monocycloalkyl or polycycloalkyl group optionally containing one or more O atoms, aryl, and aralkyl being unsubstituted or substituted as above;

Xi1 is an anion of the formula

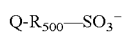

where Q is selected from $^-O_3S$ and $^-O_2C$;

$R_{500}$ is a group selected from linear or branched alkyl, cycloalkyl, aryl, or combinations thereof, optionally containing a catenary O, S or N, where the alkyl, cycloalkyl, and aryl groups are unsubstituted or substituted by one or more groups selected from the group consisting of halogen, unsubstituted or substituted alkyl, unsubstituted or substituted $C_{1-8}$ perfluoroalkyl, hydroxyl, cyano, sulfate, and nitro; and (ii) a compound of formula Ai Xi2, where Ai is an organic onium cation as previously defined and Xi2 is an anion, as well as mixtures thereof.

Examples of anion Xi2 include those selected from $CF_3SO_3^-$, $CHF_2SO_3^-$, $CH_3SO_3^-$, $CCl_3SO_3^-$, $C_2F_5SO_3^-$, $C_2HF_4SO_3^-$, $C_4F_9SO_3^-$, camphor sulfonate, perfluorooctane sulfonate, benzene sulfonate, pentafluorobenzene sulfonate, toluene sulfonate, perfluorotoluene sulfonate, $(Rf1SO_2)_3C^-$ and $(Rf1SO_2)_2N^-$, wherein each Rf1 is independently selected from the group consisting of highly fluorinated or perfluorinated alkyl or fluorinated aryl radicals and may be cyclic, when a combination of any two Rf1 groups are linked to form a bridge, further, the Rf1 alkyl chains contain from 1-20 carbon atoms and may be straight, branched, or cyclic, such that divalent oxygen, trivalent nitrogen or hexavalent sulfur may interrupt the skeletal chain, further when Rf1 contains a cyclic structure, such structure has 5 or 6 ring members, optionally, 1 or 2 of which are heteroatoms, and Rg-O—Rf2-$SO_3^-$, where Rf2 is selected from the group consisting of linear or branched $(CF_2)_j$ where j is an integer from 4 to 10 and $C_1$-$C_{12}$ cycloperfluoroalkyl divalent radical which is optionally perfluoro$C_{1-10}$alkyl substituted, Rg is selected from the group consisting of $C_1$-$C_{20}$ linear, branched, monocycloalkyl or polycycloalkyl, $C_1$-$C_{20}$ linear, branched, monocycloalkenyl or polycycloalkenyl, aryl, and aralkyl, the alkyl, alkenyl, aralkyl and aryl groups being unsubstituted, substituted, optionally containing one or more catenary oxygen atoms, partially fluorinated or perfluorinated. Further examples include those selected from $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(CF_3SO_2)_2(C_4F_9SO_2)C^-$, $(C_2F_5SO_2)_3C^-$, $(C_4F_9SO_2)_3C^-$, $(CF_3SO_2)_2(C_2F_5SO_2)C^-$, $(C_4F_9SO_2)(C_2F_5SO_2)_2C^-$, $(CF_3SO_2)(C_4F_9SO_2)N^-$, $[(CF_3)_2NC_2F_4SO_2]_2N^-$, $(CF_3)_2NC_2F_4SO_2C^-(SO_2CF_3)_2$, $(3,5-bis(CF_3)C_6H_3)SO_2N^-SO_2CF_3$, $C_6F_5SO_2C^-(SO_2CF_3)_2$, $C_6F_5SO_2N^-SO_2CF_3$,

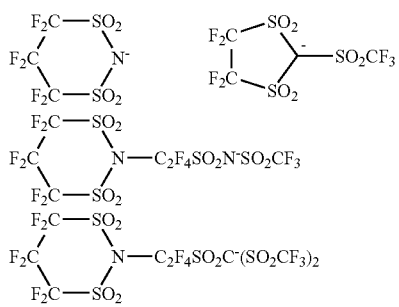

$CF_3CHFO(CF_2)_4SO_3^-$, $CF_3CH_2O(CF_2)_4SO_3^-$, $CH_3CH_2O(CF_2)_4SO_3^-$, $CH_3CH_2CH_2O(CF_2)_4SO_3^-$, $CH_3O(CF_2)_4SO_3^-$, $C_2H_5O(CF_2)_4SO_3^-$, $C_4H_9O(CF_2)_4SO_3^-$, $C_6H_5CH_2O(CF_2)_4SO_3^-$, $C_2H_5OCF_2CF(CF_3)SO_3^-$, $CH_2=CHCH_2O(CF_2)_4SO_3^-$, $CH_3OCF_2CF(CF_3)SO_3^-$, $C_4H_9OCF_2CF(CF_3)SO_3^-$, $C_8H_{17}O(CF_2)_2SO_3^-$, and $C_4H_9O(CF_2)_2SO_3^-$.

Further examples of the photoacid generators useful in the composition include those from the group bis(4-t-butylphenyl) iodonium triphenyl sulfonium perfluorobutane-1,4-disulfonate, bis(4-t-butylphenyl) iodonium triphenyl sulfonium perfluoropropane-1,3-disulfonate, bis(4-t-butylphenyl) iodonium triphenyl sulfonium perfluoropropane-1-carboxylate-3-sulfonate, bis(4-t-butylphenyl) iodonium triphenyl sulfonium perfluorobutane-1-carboxylate-4-sulfonate, bis(4-t-butylphenyl) iodonium triphenyl sulfonium perfluoromethane disulfonate, bis(4-t-butylphenyl) iodonium triphenyl sulfonium methane disulfonate, bis(4-t-butylphenyl) iodonium triphenyl sulfonium perfluoroethane disulfonate, bis(4-t-butylphenyl) iodonium triphenyl sulfonium ethane disulfonate, bis(triphenyl sulfonium) perfluorobutane-1,4-disulfonate, bis(triphenyl sulfonium) perfluoropropane-1,3-disulfonate, bis(benzoyltetramethylenesulfonium) perfluoropropane-1,3-disulfonate, bis(benzoyltetramethylenesulfonium) perfluorobutane-1,4-disulfonate, bis(tris(4-t-butylphenyl) sulfonium) perfluorobutane-1,4-disulfonate, bis(tris(4-t-butylphenyl) sulfonium) perfluoropropane-1,3-disulfonate, bis(4-t-butylphenyldiphenyl sulfonium) perfluorobutane-1,4-disulfonate, bis(4-t-butylphenyldiphenyl sulfonium) perfluoropropane-1,3-disulfonate, bis(triphenyl sulfonium) perfluoropropane-1-carboxylate-3-sulfonate, bis(triphenyl sulfonium) perfluorobutane-1-carboxylate-4-sulfonate, bis(benzoyltetramethylenesulfonium) perfluoropropane-1-carboxylate-3-sulfonate, bis(benzoyltetramethylenesulfonium) perfluorobutane-1-carboxylate-4-sulfonate, bis(tris(4-t-butyl phenyl) sulfonium) perfluoropropane-1-carboxylate-3-sulfonate, bis(tris(4-t-butyl phenyl) sulfonium) perfluorobutane-1-carboxylate-4-sulfonate, bis(4-t-butylphenyl diphenyl sulfonium) perfluoropropane-1-carboxylate-3-sulfonate, bis(4-t-butylphenyl diphenyl sulfonium) perfluorobutane-1-carboxylate-4-sulfonate, bis(4-t-butylphenyliodonium) methane disulfonate, bis(triphenyl sulfonium) methane disulfonate, bis(4-t-butylphenyl iodonium) perfluoromethane disulfonate, bis(triphenyl sulfonium) perfluoromethane disulfonate, bis(benzoyltetramethylenesulfonium) perfluoromethane disulfonate, bis(benzoyl-tetramethylenesulfonium) methane disulfonate, bis(tris(4-t-butyl phenyl) sulfonium) perfluoromethane disulfonate, bis(tris(4-t-butyl phenyl) sulfonium) methane disulfonate, bis(4-t-butylphenyl diphenylsulfonium) perfluoromethane disulfonate, bis(4-t-butylphenyl diphenylsulfonium) methane disulfonate, bis(4-octyloxyphenyl) iodonium perfluorobutane-1,4-disulfonate, bis(4-octyloxyphenyl) iodonium ethane disulfonate, bis(4-octyloxyphenyl) iodonium perfluoroethane disulfonate, bis(4-octyloxyphenyl) iodonium perfluoropropane-1,3-disulfonate, bis(4-octyloxyphenyl) iodonium perfluoropropane-1-carboxylate-3-sulfonate, bis(4-octyloxyphenyl) iodonium perfluorobutane-1-carboxylate-4-sulfonate, bis(4-octyloxyphenyl) iodonium methane disulfonate, bis(4-octyloxyphenyl) iodonium perfluoromethane disulfonate, bis(4-octyloxyphenyl) phenyl sulfonium perfluorobutane-1,4-disulfonate, bis(4-octyloxyphenyl) phenyl sulfonium ethane disulfonate, bis(4-octyloxyphenyl) phenyl sulfonium perfluoroethane disulfonate, bis(4-octyloxyphenyl) phenyl sulfonium perfluoropropane-1,3-disulfonate, bis(4-octyloxyphenyl) phenyl sulfonium perfluoropropane-1-carboxylate-3-sulfonate, bis(4-octyloxyphenyl) phenyl sulfonium perfluorobutane-1-carboxylate-4-sulfonate, bis(4-octyloxyphenyl) phenyl sulfonium methane disulfonate, bis(4-octyloxyphenyl) phenyl sulfonium perfluoromethane disulfonate, bis[bis[4-pentafluorobenzenesulfonyloxy-phenyl]phenylsulfonium]perfluorobutane-1,4-disulfonate, bis[bis[4-pentafluoro-benzene-sulfonyloxyphenyl]phenylsulfonium]ethane disulfonate, bis[bis[4-pentafluorobenzenesulfonyloxyphenyl]phenyl-sulfonium]perfluoroethane disulfonate, bis[bis[4-pentafluorobenzene-sulfonyloxyphenyl]phenylsulfonium]perfluoropropane-1,3-disulfonate, bis[bis[4-pentafluorobenzenesulfonyloxyphenyl]phenylsulfonium] perfluoropropane-1-carboxylate-3-sulfonate, bis[bis[4-pentafluorobenzenesulfonyloxy-phenyl]phenylsulfonium] perfluorobutane-1-carboxylate-4-sulfonate, bis[bis[4-pentafluorobenzenesulfonyloxyphenyl]phenylsulfonium] methane disulfonate, bis[bis[4-pentafluorobenzenesulfonyloxyphenyl]phenylsulfonium] perfluoromethane disulfonate, bis[bis[4-(3,5-di(trifluoromethyl)benzenesulfonyloxy)-phenyl]phenylsulfonium]perfluorobutane-1,4-disulfonate, bis[bis[4-(3,5-di(trifluoromethyl)-benzenesulfonyloxy)phenyl]phenylsulfonium]ethane disulfonate, bis[bis[4-(3,5-di(trifluoromethyl)benzenesulfonyloxy)phenyl]phenylsulfonium]perfluoroethane disulfonate, bis[bis[4-(3,5-di(trifluoromethyl)benzenesulfonyloxy)phenyl]phenylsulfonium]perfluoropropane-1,3-disulfonate, bis[bis[4-(3,5-di(trifluoro-methyl)-benzenesulfonyloxy)phenyl]phenylsulfonium]perfluoropropane-1-carboxylate-3-sulfonate, bis[bis[4-(3,5-di(trifluoromethyl)benzenesulfonyloxy)-phenyl]phenylsulfonium] perfluorobutane-1-carboxylate-4-sulfonate, bis[bis[4-(3,5-di(trifluoromethyl)benzenesulfonyloxy)phenyl]phenylsulfonium]methane disulfonate, bis(4-t-butylphenyl iodonium) ethane disulfonate, bis(4-t-butylphenyl iodonium) perfluoroethane disulfonate, bis(triphenyl sulfonium) ethane disulfonate, bis(triphenyl sulfonium) perfluoroethane disulfonate, bis(benzoyltetramethylene-sulfonium) perfluoroethane disulfonate, bis(benzoyltetramethylenesulfonium) ethane disulfonate, bis(tris(4-t-butyl phenyl) sulfonium) perfluoroethane disulfonate, bis(tris(4-t-butyl phenyl) sulfonium) ethane disulfonate, bis(4-t-butylphenyl diphenyl-sulfonium) perfluoroethane disulfonate, bis(4-t-butylphenyl diphenylsulfonium) ethane disulfonate, bis[bis[2-methyladamantylacetyloxymethoxyphenyl]phenyl-sulfonium]perfluorobutane-1,4-disulfonate, bis[bis[2-methyladamantylacetyloxymethoxyphenyl]phenylsulfonium]ethane disulfonate, bis[bis[2-methyl-adamantylacetyloxymethoxyphenyl] phenylsulfonium]perfluoroethane disulfonate, bis[bis[2-methyladamantylacetyloxymethoxyphenyl] phenylsulfonium]perfluoro-propane-1,3-disulfonate, bis[bis[2-methyladamantylacetyloxymethoxyphenyl] phenylsulfonium]perfluoropropane-1-carboxylate-3-sulfonate, bis[bis[2-methyl-adamantylacetyloxymethoxyphenyl]phenylsulfonium] perfluorobutane-1-carboxylate-4-sulfonate, bis[bis[2-methyladamantylacetyloxymethoxyphenyl] phenylsulfonium]methane disulfonate, bis[bis[2-methyladamantylacetyloxy-methoxyphenyl] phenylsulfonium]perfluoromethane disulfonate, bis[bis[4,4-bis(trifluoromethyl)-3-oxatricyclo[4.2.1.0$^{2,5}$]-nonylmethoxyphenyl]phenyl sulfonium]perfluorobutane-1,4-disulfonate, bis[bis[4,4-bis(trifluoromethyl)-3-oxatricyclo-[4.2.1.0$^{2,5}$]-nonylmethoxy-phenyl]phenyl sulfonium]ethane disulfonate, bis[bis[4,4-bis(trifluoromethyl)-3-oxatricyclo[4.2.1.0$^{2,5}$]-nonylmethoxyphenyl]phenyl sulfonium]-perfluoroethane disulfonate, bis[bis[4,4-bis(trifluoromethyl)-3-oxatricyclo[4.2.1.0$^{2,5}$]-nonylmethoxyphenyl]phenyl sulfonium]perfluoropropane-1,3-disulfonate, bis[bis[4,4-bis(trifluoro-methyl)-3-oxatricyclo[4.2.1.0$^{2,5}$]-nonylmethoxyphenyl]phenyl sulfonium]-perfluoropropane-1-carboxylate-3-sulfonate, bis[bis[4,4-bis(trifluoro-methyl)-3-oxatricyclo[4.2.1.0$^{2,5}$]-nonylmethoxyphenyl]phenyl sulfonium]perfluoro-butane-1-carboxylate-4-sulfonate, bis[bis[4,4-bis(trifluoromethyl)-3-oxatricyclo-[4.2.1.0$^{2,5}$]-nonylmethoxyphenyl]phenyl sulfonium]methane disulfonate, bis[bis[4,4-bis(trifluoromethyl)-3-oxatricyclo[4.2.1.0$^{2,5}$]-nonylmethoxyphenyl]phenyl sulfonium]perfluoromethane disulfonate, bis(4-t-butylphenyl)iodonium bis-perfluoroethane sulfonimide, diphenyliodonium trifluoromethane sulfonate, diphenyliodonium nonafluorobutane sulfonate, triphenylsulfonium trifluromethane sulfonate, 4-methoxy-3,5-dimethylphenyl)dimethyl sulfonium perfluorobutane sulfonate, bis(p-tertbutyl phenyl)iodonium cyclo(1,3-perfluoropropane disulfone)imidate, triphenylsulfonium nonafluorobutane sulfonate, triphenylsulfonium perfluoroethanesulfonylimide, 4-(1-butoxyphenyl)diphenylsulfonium bis-(perfluorobutanesulfonyl)imide, 4-(1-butoxyphenyl) diphenylsulfonium bis-(perfluoroethanesulfonyl)imide, 2,4,6-trimethylphenyldiphenylsulfonium bis-perfluorobutanesulfonyl)imide, 2,4,6-trimethylphenyldiphenylsulfonium bis-(perfluoroethanesulfonyl)imide, toluenediphenylsulfonium bis-(perfluorobutanesulfonyl)imide, toluenediphenyl-sulfonium bis-(perfluoroethanesulfonyl)imide, toluene-diphenylsulfonium-(trifluoromethyl perfluorobutylsulfonyl) imide, tris-(tert-butylphenyl)sulfonium-(trifluoromethyl perfluorobutylsulfonyl)imide, tris-(tert-butylphenyl)sulfonium bis-(perfluorobutanesulfonyl)imide, and tris-(tert-butylphenyl)sulfonium-bis-(trifluoromethanesulfonyl)imide.

The photoacid generators of formula $(Ai)_2 Xi1$ can be made in accordance with the procedures set forth in U.S. patent application Ser. No. 11/179,886, filed Jul. 12, 2005, and Ser. No. 11/355,762, filed Feb. 16, 2006, the contents of which are hereby incorporated herein by reference. Other examples are found in U.S. patent application Ser. No. 11/355,400, filed Feb. 16, 2006, United States Published Patent Application 2004-0229155, and United States Published Patent Application 2005-0271974, U.S. Pat. No. 5,837,420, U.S. Pat. No. 6,111,143, and U.S. Pat. No. 6,358,665, the contents of which are hereby incorporated herein by reference. The photoacid generators of formula Ai Xi2 are well known to those skilled in the art, for example, those known from U.S. Pat. No. 6,991,888, United States Patent Application No. 20030235782 and United States Patent Application No. 20050271974, the contents of which are hereby incorporated herein by reference.

The term alkyl as used herein means a straight or branched chain hydrocarbon. Representative examples of alkyl include, but are not limited to, methyl, ethyl, n-propyl, isopropyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl.

Alkylene refers to divalent alkyl radicals, which can be linear or branched, such as, for example, methylene, ethylene, propylene, butylene or the like.

By the term aryl is meant a radical derived from an aromatic hydrocarbon by the elimination of one atom of hydrogen and can be substituted or unsubstituted. The aromatic hydrocarbon can be mononuclear or polynuclear. Examples of aryl of the mononuclear type include phenyl, tolyl, xylyl, mesityl, cumenyl, and the like. Examples of aryl of the polynuclear type include naphthyl, anthryl, phenanthryl, and the like. The aryl group can be unsubstituted or substituted as provided for hereinabove.

The term alkoxy refers to a group of alkyl-O—, where alkyl is defined herein. Representative examples of alkoxy include, but are not limited to, methoxy, ethoxy, propoxy, 2-propoxy, butoxy, tert-butoxy, pentyloxy, and hexyloxy.

The term aryloxy refers to a group of aryl-O—, where aryl is defined herein.

By the term aralkyl is meant an alkyl group containing an aryl group. It is a hydrocarbon group having both aromatic and aliphatic structures, that is, a hydrocarbon group in which a lower alkyl hydrogen atom is substituted by a mononuclear or polynuclear aryl group. Examples of aralkyl groups include, without limitation, benzyl, 2-phenyl-ethyl, 3-phenyl-propyl, 4-phenyl-butyl, 5-phenyl-pentyl, 4-phenylcyclohexyl, 4-benzylcyclohexyl, 4-phenylcyclohexylmethyl, 4-benzylcyclohexylmethyl, naphthylmethyl, and the like.

The term monocycloalkyl as used herein, refers to an optionally substituted, saturated or partially unsaturated monocycloalkyl ring system, where if the ring is partially unsaturated, it is then a monocycloalkenyl group. The term polycycloalkyl as used herein refers to an optionally substituted, saturated or partially unsaturated polycycloalkyl ring system containing two or more rings, where if the ring is partially unsaturated, it is then a polycycloalkenyl group. Examples of monocycloalkyl or polycycloalkyl groups optionally containing one or more O atoms are well know to those skilled in the art and include, for example, cyclopropyl, cyclobutyl, cyclopentyl, cycloheptyl, cyclohexyl, 2-methyl-2-norbornyl, 2-ethyl-2-norbornyl, 2-methyl-2-isobornyl, 2-ethyl-2-isobornyl, 2-methyl-2-adamantyl, 2-ethyl-2-adamantyl, 1-adamantyl-1-methylethyl, adamantyl, tricyclodecyl, 3-oxatricyclo[4.2.1.0$^{2,5}$]nonyl, tetracyclododecanyl, tetracyclo[5.2.2.0.0]undecanyl, bornyl, isobornyl norbornyl lactone, adamantyl lactone and the like.

The term alkoxycarbonylalkyl embraces alkyl radicals substituted with an alkoxycarbonyl radical as defined herein. Examples of alkoxycarbonylalkyl radicals include methoxycarbonylmethyl [CH$_3$O—C(=O)—CH$_2$—], ethoxycarbonyl methyl [CH$_3$CH$_2$O—C(=O)—CH$_2$—], methoxycarbonylethyl [CH$_3$O—C(=O)—CH$_2$CH$_2$—], and ethoxycarbonylethyl [CH$_3$CH$_2$O—C(=O)—CH$_2$CH$_2$—].

The term alkylcarbonyl as used herein means an alkyl group, as defined herein, appended to the parent molecular moiety through a carbonyl group, as defined herein, which can be generically represented as alkyl-C(O)—. Representative examples of alkylcarbonyl include, but are not limited to acetyl (methyl carbonyl), butyryl (propylcarbonyl), octanoyl (heptylcarbonyl), dodecanoyl (undecylcarbonyl), and the like.

Alkoxycarbonyl means alkyl-O—C(O)—, wherein alkyl is as previously described. Non-limiting examples include methoxycarbonyl [CH$_3$O—C(O)—] and the ethoxycarbonyl [CH$_3$CH$_2$O—C(O)—], benzyloxycarbonyl [C$_6$H$_5$CH$_2$O—C(O)—] and the like.

Alkoxyalkyl means that a terminal alkyl group is linked through an ether oxygen atom to an alkyl moiety, which can be generically represented as alkyl-O— alkyl wherein the alkyl groups can be linear or branched. Examples of alkoxyalkyl include, but are not limited to, methoxypropyl, methoxybutyl, ethoxypropyl, methoxymethyl Monocycloalkyl- or polycycloalkyloxycarbonylalkyl means that a terminal monocycloalkyl or polycycloalkyl group is linked through —O—C(=O)— to an alkyl moiety, generically represented as monocycloalkyl- or polycycloalkyl-O—C(=O)-alkyl.

Monocycloalkyl- or polycycloalkyloxyalkyl means that a terminal monocycloalkyl or polycycloalkyl group is linked through an ether oxygen atom to an alkyl moiety, which can be generically represented as monocycloalkyl- or polycycloalkyl-O-alkyl.

Monocyclofluoroalkyl- or polycyclofluoroalkyl means a monocyclalkyl- or polycycloalkyl group substituted with one or more fluorine atoms.

Examples of substtituents which can be placed on the alkyl, aryl, aralkyl, and the other groups mentioned above, including those on the groups defined as $R_{30}$, $R_{31}$, $R_{32}$, $R_{33}$, $R_5$, $R_{40}$, $R_{41}$, and $R_{42}$, include, but are not limited to, halogen, hydroxyl, sulfate, nitro, perfluoroalkyl, oxo, alkyl, alkoxy, aryl, and the like, etc.

The solid components of the present invention are dissolved in an organic solvent. The amount of solids in the solvent or mixture of solvents ranges from about 1 weight % to about 50 weight %. The polymer may be in the range of 5 weight % to 90 weight % of the solids and the photoacid generators may be in the range of 0.4 weight % to about 50 weight % of the solids. Suitable solvents for such photoresists may include for example ketones such as acetone, methyl ethyl ketone, methyl isobutyl ketone, cyclohexanone, isophorone, methyl isoamyl ketone, 2-heptanone 4-hydroxy, and 4-methyl 2-pentanone; $C_1$ to $C_{10}$ aliphatic alcohols such as methanol, ethanol, and propanol; aromatic group containing—alcohols such as benzyl alcohol; cyclic carbonates such as ethylene carbonate and propylene carbonate; aliphatic or aromatic hydrocarbons (for example, hexane, toluene, xylene, etc and the like); cyclic ethers, such as dioxane and tetrahydrofuran; ethylene glycol; propylene glycol; hexylene glycol; ethylene glycol monoalkylethers such as ethylene glycol monomethylether, ethylene glycol monoethylether; ethylene glycol alkylether acetates such as methylcellosolve acetate and ethylcellosolve acetate; ethylene glycol dialkylethers such as ethylene glycol dimethylether, ethylene glycol diethylether, ethylene glycol methylethylether, diethylene glycol monoalkylethers such as diethylene glycol monomethylether, diethylene glycol monoethylether, and diethylene glycol dimethylether; propylene glycol monoalkylethers such as propylene glycol methylether, propylene glycol ethylether, propylene glycol propylether, and propylene glycol butylether; propylene glycol alkyletheracetates such as propylene glycol methylether acetate, propylene glycol ethylether acetate, propylene glycol propylether acetate, and propylene glycol butylether acetate; propylene glycol alkyletherpropionates such as propylene glycol methyletherpropionate, propylene glycol ethyletherpropionate, propylene glycol propyletherpropionate, and propylene glycol butyletherpropionate; 2-methoxyethyl ether (diglyme); solvents that have both ether and hydroxy moieties such as methoxy butanol, ethoxy butanol, methoxy propanol, and ethoxy propanol; esters such as methyl acetate, ethyl acetate, propyl acetate, and butyl acetate methyl-pyruvate, ethyl pyruvate; ethyl 2-hydroxy propionate, methyl 2-hydroxy 2-methyl propionate, ethyl 2-hydroxy 2-methyl propionate, methyl hydroxy acetate, ethyl hydroxy acetate, butyl hydroxy acetate, methyl lactate, ethyl lactate, propyl lactate, butyl lactate, methyl 3-hydroxy propionate, ethyl 3-hydroxy propionate, propyl 3-hydroxy propionate, butyl 3-hydroxy propionate, methyl 2-hydroxy 3-methyl butanoic acid, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate; oxyisobutyric acid esters, for example, methyl-2-hydroxyisobutyrate, methyl α-methoxyisobutyrate, ethyl methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl β-isopropoxyisobutyrate, ethyl β-isopropoxyisobutyrate, isopropyl β-isopropoxyisobutyrate, butyl β-isopropoxyisobutyrate, methyl β-butoxyisobutyrate, ethyl β-butoxyisobutyrate, butyl β-butoxyisobutyrate, methyl α-hydroxyisobutyrate, ethyl α-hydroxyisobutyrate, isopropyl α-hydroxyisobutyrate, and butyl α-hydroxyisobutyrate; solvents that have both ether and hydroxy moieties such as methoxy butanol, ethoxy butanol, methoxy propanol, and ethoxy propanol; and other solvents such as dibasic esters, and gamma-butyrolactone.; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

Another component of the composition is one or more bases.

Examples of the bases include substituted or unsubstituted guanidines, substituted or unsubstituted aminopyridines, substituted or unsubstituted aminoalkylpyridines, substituted or unsubstituted aminopyrrolidines, substituted or unsubstituted acetamides, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, substituted or unsubstituted aminoalkylmorpholines, mono-, di- or trialkylamines, substituted or unsubstituted anilines, substituted or unsubstituted piperidines and mono- or diethanolamine. Examples of the substtituents include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Examples of the bases include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methyl pyrazole, 5-amino-3-methyl-1-p-tolylpyrazole, N-(1-adamantyl)acetamide, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 2,4,5-triphenylimidazole, tri(n-butyl) amine, tri(n-octyl)amine, N-phenyldiethanolamine, N-hydroxyethylpiperidine, 2,6-diisopropylaniline, N-cyclohexyl-N'-morpholinoethylthiourea, hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylarine, methyldidecylamine, ethyldibutylamine, ethydipentylamine, ethyldihexylaamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-diisopropylaniline, imidazole, pyridine, 4-methylpyridine, 4-methylmidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "choline"), N-methylpyrrolidone, dimethylimidazole, and the like.

Other examples include N-tert-butoxycarbonyl derivatives of amino acids such as, for example, 2-aminopropanoic acid, 2-amino-5-guanidinopentanoic acid, 2-amino-3-carbamoylpropanoic acid, 2-aminobutanedioic acid, 2-amino-3-mercaptopropanoic acid, 2-amino-4-carbamoylbutanoic acid, 2-aminopentanedioic acid, aminoethanoic acid, 2-amino-3-(1H-imidazol-4-yl)-propanoic acid, 2-amino-3-methylpentanoic acid, 2-amino-4-methylpentanoic acid, 2,6-diaminohexanoic acid, 2-amino-4-(methylthio)butanoic acid, 2-amino-3-phenylpropanoic acid, pyrrolidine-2-carboxylic acid, 2-amino-3-hydroxypropanoic acid, 2-amino-3-hydroxybutanoic acid, 2-amino-3-(IH-indol-3-yl)-propanoic acid, 2-amino-3-(4-hydroxyphenyl)-propanoic acid, 2-amino-3-methylbutanoic acid, and the like.

Mixtures of the foregoing bases are also possible, for example, those shown in the examples below.

Various other additives such as colorants, non-actinic dyes, anti-striation agents, plasticizers, adhesion promoters, dissolution inhibitors, coating aids, photospeed enhancers, additional photoacid generators, and solubility enhancers (for example, certain small levels of solvents not used as part of the main solvent (examples of which include glycol ethers and glycol ether acetates, valerolactone, ketones, lactones, and the like), and surfactants may be added to the photoresist composition before the solution is coated onto a substrate.

The prepared photoresist composition solution can be applied to a substrate by any conventional method used in the photoresist art, including dipping, spraying, and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over antireflective coatings.

The photoresist coatings produced by the described procedure are particularly suitable for application to silicon/silicon dioxide wafers, such as are utilized in the production of microprocessors and other miniaturized integrated circuit components. An aluminum/aluminum oxide wafer can also be used. The substrate may also comprise various polymeric resins, especially transparent polymers such as polyesters.

The photoresist composition solution is then coated onto the substrate, and the substrate is treated (baked) at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature. Treatment (baking) is conducted until substantially all of the solvents have evaporated and a thin coating of photoresist composition, on the order of half a micron (micrometer) in thickness, remains on the substrate. In a preferred embodiment the temperature is from about 95° C. to about 120° C. The treatment is conducted until the rate of change of solvent removal becomes relatively insignificant. The film thickness, temperature and time selection depends on the photoresist properties desired by the user, as well as the equipment used and commercially desired coating times. The coated substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 150° C., more preferably from about 100° C. to about 130° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred developer is an aqueous solution of tetramethyl ammonium hydroxide. After removal of the coated wafers from the developing solution, one may conduct an optional post-development heat treatment or bake to increase the coating's adhesion and chemical resistance to etching conditions and other substances. The post-development heat treatment can comprise the oven baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid base etching solution or dry etching. Prior to dry etching the photoresist may be treated to electron beam curing in order to increase the dry-etch resistance of the photoresist.

The invention further provides a method for producing a semiconductor device by producing a photo-image on a substrate by coating a suitable substrate with a photoresist composition. The subject process comprises coating a suitable substrate with a photoresist composition and heat treating the coated substrate until substantially all of the photoresist solvent is removed; image-wise exposing the composition and removing the image-wise exposed areas of such composition with a suitable developer.

The following examples provide illustrations of the methods of producing and utilizing the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

Example A

Synthesis of poly(2-ethyl-2-adamantyl methacrylate-co-3-oxo-1-adamantyloxymethyl methacrylate-co-hydroxy-1-adamantyl acrylate-co-α-gamma-butyrolactone methacrylate)

Into a reaction vessel, equipped with an agitator, a thermometer, a reflux condenser, and a tube for introducing nitrogen gas, were introduced under a nitrogen blanket tetrahydrofuran, di(4-tert-butylcyclohexyl) peroxydicarbonate as the initiator, and the following monomers: 2-ethyl-2-adamantyl methacrylate, 3-oxo-1-adamantyloxymethyl methacrylate, hydroxy-1-adamantyl acrylate, and α-gamma-butyrolactone methacrylate (in a molar feed ratio of 15/15/40/30).

When the reactants were completely dissolved in the solution, the reaction flask was heated to the boiling temperature of tetrahydrofuran. The reaction mixture is allowed to stir at reflux for 5 hours under nitrogen atmosphere. The heat source was then removed and the polymer solution is allowed to cool down to room temperature. About 650 ml of methanol was poured into a blender and 100 ml of polymer solution in tetrahydrofuran was poured into the blender and the blender is run for about 30-60 seconds. The resulting polymer suspension was poured onto a sintered glass funnel. This was repeated until all of the polymer solution in tetrahydrofuran has been processed. The suspension was allowed to dry on the filter under vacuum, until it becomes dry. The dry solid was weighed and transferred into a conical flask equipped with a stirrer. An appropriate amount of tetrahydrofuran was added to the flask with the solid to make up 30% of solid content. The mixture was then allowed to mix until the entire solid was dissolved. A second precipitation is performed with methanol in the same way as previously described above. The suspension is filtered and washed twice with methanol. The solid is then allowed to dry under vacuum. This is repeated except the precipitation is done with hexane, not methanol. The suspension is filtered and dried on the filter under vacuum. The resulting polymer product is further dried in a vacuum oven at 60° C.

The other polymers herein can be made in a similar manner.

Example B

Synthesis of triphenylsulfonium tris-perfluoromethane sulfonmethide

This material can be made following the procedure outlined in Example 5 of United States Published Patent Application No. 20070111138 using triphenysulfonium perfluorobutanesulfonate and lithium tris-perfluoromethane sulfonmethide as the reactants.

Example C

Synthesis of bis(p-tertbutyl phenyl)iodonium perfluoroethane sulfonylimide

This material can be made following the procedure outlined in Example 10 of United States Published Patent Application No. 20030235782 using bis(p-tertbutyl phenyl)iodonium chloride in place of 4-hydroxy-3,5-dimethyl phenyl dimethyl sulfonium chloride.

Example D

Synthesis of bis(triphenylsulfonium) perfluorobutane-1,4-disulfonate

This material can be made according to Example 1 of United States Published Patent Application No. 20070015084.

Example E

Synthesis of bis(4-tertbutylphenyliodonium) perfluorobutane-1,4-disulfonate

This material can be made by the procedure outlined in Example 33 of United States Published Patent Application No. 20070015084 using bis(4-tertbutylpheny)iodonium chloride in place of bis(4-octyloxyphenyl)iodonium antimonite.

FORMULATION EXAMPLE 1

0.4725 g of the copolymer from Example A (poly(2-ethyl-2-adamantyl methacrylate-co-3-oxo-1-adamantyloxymethyl methacrylate-co-hydroxy-1-adamantyl acrylate-co-α-gamma-butyrolactone methacrylate)), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (31% based on total PAG moles) and phenyldiethanolamine (8% based on total PAG moles), 11.5782 g of methyl α-hydroxyisobutyrate, 2.8447 g of propylene glycol monomethyl ether, and 0.0503 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 2

1.8901 g of poly(2-ethyl-2-adamantyl methacrylate-co-ethylcyclopentylmethacrylate-co-hydroxy-1-adamantyl acrylate-co-α-gamma-butyrolactone methacrylate), 2,6-diisopropylaniline (38.6% based on total PAG moles), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 46.3128 g of methyl α-hydroxyisobutyrate, 11.3788 g of propylene glycol monomethyl ether, and 0.2012 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 3

0.7875 g of poly(2-ethyl-2-adamantyl methacrylate-co-ethylcyclopentylmethacrylate-co-hydroxy-1-adamantyl acrylate-co-α-gamma-butyrolactone methacrylate), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (31% based on total PAG moles) and phenyldiethanolamine (8% based on total PAG moles), 19.2970 g of methyl α-hydroxyisobutyrate, 4.7412 g of propylene glycol monomethyl ether, and 0.0838 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 4

0.7872 g of poly(2-ethyl-2-adamantyl methacrylate-co-ethylcyclopentylmethacrylate-co-2-adamantyloxymethyl methacrylate-co-hydroxy-1-adamantyl acrylate-co-α-gamma-butyrolactone methacrylate), bis(p-tertbutyl phenyl) iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (19.3% based on total PAG moles) and N-(tert-butoxycarbonyl)-L-alanine methyl ester (19.3% based on total PAG moles), 19.2970 g of methyl α-hydroxyisobutyrate, 4.7412 g of propylene glycol monomethyl ether, and 0.0838 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 5

0.7875 g of poly(2-ethyl-2-adamantyl methacrylate-co-ethylcyclopentylmethacrylate-co-hydroxy-1-adamantyl acrylate-co-α-gamma-butyrolactone methacrylate-co-2-oxoadamantyl methacrylate), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (19.3% based on total PAG moles) and phenyldiethanolamine (8% based on total PAG moles), 19.2970 g of methyl α-hydroxyisobutyrate, 4.7412 g of propylene glycol monomethyl ether, and 0.0838 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 6

1.2565 g of poly(2-ethyl-2-adamantyl methacrylate-co-ethylcyclopentylmethacrylate-co-hydroxy-1-adamantyl acrylate-co-α-gamma-butyrolactone methacrylate), triphenylsulfonium tris-perfluoromethane sulfonmethide (142.7 micromoles based on polymer), 2,6-diisopropylaniline (31% based on total PAG moles) and phenyldiethanolamine (8% based on total PAG moles), 30.8752 g of methyl α-hydroxyisobutyrate, 7.5270 g of propylene glycol monomethyl ether, and 0.1930 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 7

0.9454 g of poly(2-ethyl-2-adamantyl methacrylate-co-2-adamantyloxymethyl methacrylate-co-hydroxy-1-adamantyl acrylate-co-α-gamma-butyrolactone methacrylate-co-2-adamantyl methacrylate), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (13% based on total PAG moles) and tris[2-(2-methoxyethoxy)ethyl]amine (13% based on total PAG moles), 23.1564 g of methyl α-hydroxyisobutyrate, 5.6894 g of propylene glycol monomethyl ether, and 0.1006 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 8

0.9519 g of poly(2-ethyl-2-adamantyl methacrylate-co-ethylcyclopentylmethacrylate-co-hydroxy-1-adamantyl acrylate-co-α-gamma-butyrolactone methacrylate-co-2-oxoadamantyl methacrylate), triphenylsulfonium tris-perfluoromethane sulfonmethide/bis(p-tertbutylphenyliodonium) perfluorobutane-1,4-disulfonate in a ratio of 60/47 (in micromoles based on polymer), 2,6-diisopropylaniline (13% based on total PAG moles) and N-(tert-butoxycarbonyl)-L-alanine methyl ester (13% based on total PAG moles), 23.1564 g of methyl α-hydroxyisobutyrate, 5.6453 g of propylene glycol monomethyl ether, and 0.1448 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 9

1.8901 g of poly(2-ethyl-2-adamantyl methacrylate-co-2-adamantyloxymethyl methacrylate-co-hydroxy-1-adamantyl acrylate-co-α-gamma-butyrolactone methacrylate-co-2-adamantyl methacrylate), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (38.6% based on total PAG moles), 46.3128 g of methyl α-hydroxyisobutyrate, 11.3788 g of propylene glycol monomethyl ether, and 0.2012 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 10

0.9450 g of poly(ethylcyclopentylmethacrylate-co-2-adamantyloxymethyl methacrylate-co-hydroxy-1-adamantyl acrylate-co-α-gamma-butyrolactone methacrylate), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (31% based on total PAG moles) and phenyldiethanolamine (8% based on total PAG moles), 23.1564 g of methyl α-hydroxyisobutyrate, 5.6894 g of propylene glycol monomethyl ether, and 0.1006 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 11

0.9469 g of poly(2-ethyl-2-adamantyl methacrylate-co-2-adamantyloxymethyl methacrylate-co-hydroxy-1-adamantyl acrylate-co-α-gamma-butyrolactone methacrylate), bis(p-tertbutyl phenyl)iodonium perfluoroethanesulfonylimide/bis(triphenylsulfonium) perfluorobutane-1,4-disulfonate/bis(p-tert-butylphenyliodonium) perfluorobutane-1,4-disulfonate in a ratio of 30/30/47 (in micromoles based on polymer), 2,6-diisopropylaniline (13% based on total PAG moles) and N-(1-adamantyl)acetamide (13% based on total PAG moles), 23.1564 g of methyl α-hydroxyisobutyrate, 5.6894 g of propylene glycol monomethyl ether, and 0.1008 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 12

1.2932 g of poly(2-methyl-2-adamantyl methacrylate-co-5-methacryloyloxy-2,6-norbornanecarbolactone-co-β-gamma-butyrolactone methacrylate), triphenyl sulfonium perfluorobutane sulfonate/bis(p-tertbutyl phenyl)iodonium perfluoroethanesulfonylimide/4-methoxy-3,5-dimethylphenyl)dimethyl sulfonium perfluorobutane sulfonate in a ratio of 15/37.5/7.5 (in micromoles based on polymer), 2,6-diisopropylaniline (26% based on total PAG moles), 28.6464 g of mixture of propylene glycol monomethyl ether acetate and propylene glycol monomethyl ether (70/30 w/w) were mixed into a 60 ml metal-free plastic bottle at ambient conditions. The mixture was rolled for at least 12 hours and was filtered through a 0.2 µm filter. A clear solution was formed.

FORMULATION EXAMPLE 13

0.9450 g of poly(2-ethyl-2-adamantyl methacrylate-co-hydroxy-1-adamantyl methacrylate-co-β-gamma-butyrolactone methacrylate), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (31% based on total PAG moles) and phenyldiethanolamine (8% based on total PAG moles), 23.1564 g of methyl α-hydroxyisobutyrate, 5.6894 g of propylene glycol monomethyl ether, and 0.1006 g of gamma valerolactone were mixed into a 60 ml metal-free plastic bottle at ambient conditions. The mixture was rolled for at least 12 hours and was filtered through a 0.2 µm filter. A clear solution was formed.

FORMULATION EXAMPLE 14

0.7890 g of poly(2-ethyl-2-adamantyl methacrylate-co-ethylcyclopentylmethacrylate-co-hydroxy-1-adamantyl acrylate-co-α-gamma-butyrolactone methacrylate), bis(p-tertbutyl phenyl)iodonium cyclo(1,3-perfluoropropane disulfone)imidate/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (19.3% based on total PAG moles) and N-(tert-butoxycarbonyl)-L-alanine methyl ester (19.3% based on total PAG moles), 19.297 g of methyl α-hydroxyisobutyrate, 4.741 g of propylene glycol monomethyl ether, and 0.084 g of gamma valerolactone were mixed into a 60 ml metal-free plastic bottle at ambient conditions. The mixture was rolled for at least 12 hours and was filtered through a 0.2 µm filter. A clear solution was formed.

FORMULATION EXAMPLE 15

0.9522 g of poly(2-ethyl-2-adamantyl methacrylate-co-2-adamantyloxymethyl methacrylate-co-hydroxy-1-adamantyl acrylate-co-α-gamma-butyrolactone methacrylate), triphenylsulfonium perfluoroethanesulfonylimide/bis(p-tertbutylphenyliodonium) perfluorobutane-1,4-disulfonate in a ratio of 60/47 (in micromoles based on polymer), 2,6-diisopropylaniline (20.8% based on total PAG moles) and phenyldiethanolamine (5.2% based on total PAG moles), 23.1564 g of methyl α-hydroxyisobutyrate, 5.6453 g of propylene glycol monomethyl ether, and 0.1448 g of gamma valerolactone were mixed into a 60 ml metal-free plastic bottle at ambient conditions. The mixture was rolled for at least 12 hours and was filtered through a 0.2 µm filter. A clear solution was formed.

FORMULATION EXAMPLE 16

1.8179 g of poly(2-ethyl-2-adamantyl methacrylate-co-2-adamantyloxymethyl methacrylate-co-hydroxy-1-adamantyl acrylate-co-α-gamma-butyrolactone methacrylate), triphenylsulfonium perfluorobutane sulfonate/bis(p-tertbutyl phenyl)iodonium perfluoroethanesulfonylimide in a ratio of 16/40 (in micromoles based on polymer), 2,6-diisopropylaniline (17.5% based on total PAG moles) and trioctylamine (17.5% based on total PAG moles), 17.13 g of a mixture of propylene glycol monomethyl ether acetate and propylene glycol monomethyl ether (70:30 weight ratio) were mixed into a 60 ml metal-free plastic bottle at ambient conditions. The mixture was rolled for at least 12 hours and was filtered through a 0.2 µm filter. A clear solution was formed.

FORMULATION EXAMPLE 17

0.9186 g of poly(2-ethyl-2-adamantyl methacrylate-co-2-adamantyloxymethyl methacrylate-co-hydroxy-1-adamantyl acrylate-co-α-gamma-butyrolactone methacrylate-co-2-adamantyl methacrylate), 2,6-diisopropylaniline (35% based on total PAG moles), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/18/23 (in micromoles based on polymer), benzoylmethyldodecylmethylsulfonium perfluoroethanesulfonylimide (10% based on polymer), 16.8054 g of methyl α-hydroxyisobutyrate, 4.1433 g of propylene glycol monomethyl ether, and 0.0587 g of gamma valerolactone were mixed into a 60 ml metal-free plastic bottle at ambient conditions. The mixture was rolled for at least 12 hours and was filtered through a 0.2 µm filter. A clear solution was formed.

FORMULATION EXAMPLE 18

0.0945 g of poly(2-ethyl-2-adamantyl methacrylate-co-hydroxy-1-adamantyl acrylate-co-α-gamma-butyrolactone methacrylate-co-tricyclo[5,2,1,0$^{2,6}$]deca-8-yl methacrylate), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (31% based on total PAG moles) and phenyldiethanolamine (8% based on total PAG moles), 23.1564 g of methyl α-hydroxyisobutyrate, 45.6894 g of propylene glycol monomethyl ether, and 0.1006 g of gamma valerolactone were mixed into a 60 ml metal-free plastic bottle at ambient conditions. The mixture was rolled for at least 12 hours and was filtered through a 0.2 µm filter. A clear solution was formed.

FORMULATION EXAMPLE 19

0.9450 g of poly(2-ethyl-2-adamantyl methacrylate-co-ethylcyclopentylmethacrylate-co-2-adamantyloxymethyl methacrylate-co-hydroxy-1-adamantyl acrylate-co-α-gamma-butyrolactone methacrylate), bis(p-tertbutyl phenyl) iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6- diisopropylaniline (31% based on total PAG moles) and phenyldiethanolamine (8% based on total PAG moles), 23.1564 g of methyl α-hydroxyisobutyrate, 5.6894 g of propylene glycol monomethyl ether, and 0.1006 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 20

0.9450 g of poly(2-ethyl-2-adamantyl methacrylate-co-2-adamantyloxymethyl methacrylate-co-hydroxy-1-adamantyl acrylate-co-α-gamma-butyrolactone methacrylate) [feed ratio of monomers—20/10//30/40], bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (31% based on total PAG moles) and phenyldiethanolamine (8% based on total PAG moles), 23.1564 g of methyl α-hydroxyisobutyrate, 5.6894 g of propylene glycol monomethyl ether, and 0.1006 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 21

0.7200 g of poly(2-ethyl-2-adamantyl methacrylate-co-2-adamantyloxymethyl methacrylate-co-hydroxy-1-adamantyl acrylate-co-α-gamma-butyrolactone methacrylate) [feed ratio of monomers—15/15/30/40], bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (31% based on total PAG moles) and phenyldiethanolamine (8% based on total PAG moles), 19.3570 g of methyl α-hydroxyisobutyrate, 4.7634 g of propylene glycol monomethyl ether, and 0.0766 g of gamma valerolactone were mixed into a 60 ml metal-free plastic bottle at ambient conditions. The mixture was rolled for at least 12 hours and was filtered through a 0.2 μm filter. A clear solution was formed.

FORMULATION EXAMPLE 22

0.7875 g of poly(2-ethyl-2-adamantyl methacrylate-co-ethylcyclopentylmethacrylate-co-hydroxy-1-adamantyl acrylate-co-5-acryloyloxy-2,6-norbornanecarbolactone), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/30/47 (in micromoles based on polymer), 2,6-diisopropylaniline (31% based on total PAG moles) and phenyldiethanolamine (8% based on total PAG moles), 19.2970 g of methyl α-hydroxyisobutyrate, 4.7412 g of propylene glycol monomethyl ether, and 0.0838 g of gamma valerolactone were mixed into a 60 ml metal-free plastic bottle at ambient conditions. The mixture was rolled for at least 12 hours and was filtered through a 0.2 μm filter. A clear solution was formed.

COMPARATIVE FORMULATION EXAMPLE 1

0.9186 g of poly(2-adamantyloxymethyl methacrylate-co-hydroxy-1-adamantyl acrylate-co-α-gamma-butyrolactone methacrylate-co-2-adamantyl methacrylate), 2,6-diisopropylaniline (35% based on total PAG moles), bis(p-tertbutyl phenyl)iodonium perfluoroethanesulfonylimide/bis(triphenylsulfonium) perfluorobutane-1,4-disulfonate/bis(p-tertbutylphenyliodonium) perfluorobutane-1,4-disulfonate in a ratio of 30/18/23 (in micromoles based on polymer), benzoylmethyldodecylmethylsulfonium perfluoroethanesulfonylimide (10% based on polymer), 16.8054 g of methyl α-hydroxyisobutyrate, 4.1433 g of propylene glycol monomethyl ether, and 0.0587 g of gamma valerolactone were mixed into a 60 ml metal-free plastic bottle at ambient conditions. The mixture was rolled for at least 12 hours and was filtered through a 0.2 μm filter. A clear solution was formed.

The above formulations were evaluated using the following procedure: A silicon substrate coated with a bottom anti-reflective coating (B.A.R.C.) was prepared by spin coating the bottom anti-reflective coating solution (AZ® ArF-38, B.A.R.C. available from AZ Electronic Materials Corporation, Somerville, N.J.) onto the silicon substrate and baking at 225° C. for 90 sec. The B.A.R.C film thickness was 87 nm. The photoresist solutions prepared above were then coated on the B.A.R.C coated silicon substrate. The spin speed was adjusted such that the photoresist film thickness was 120 nm, soft baked at 90-100° C.[see Table 1 for examples]/60 s, exposed with Nikon 306D 0.85NA & dipole illumination using 6% half-tone mask. The exposed wafer was post exposure baked at 95-110° C.[see Table 1 for examples]/60 s, and developed using a 2.38 weight % aqueous solution of tetramethyl ammonium hydroxide for 30 sec. The line and space patterns were then measured on a AMAT CD SEM. Evaluation data for formulation examples are shown in Table 1 below.

TABLE 1

| Formulation Example | Bakes, ° C. | Sensitivity, mJ | EL, % | DoF | LER | LWR |
|---|---|---|---|---|---|---|
| 1 | 100/105 | 48 | 12.79 | 0.3 | 4.34 | 6.32 |
| 2 | 100/110 | 42 | 13.86 | 0.3 | 4.79 | 6.94 |
| 3 | 100/110 | 44 | 12.32 | 0.375 | 4.41 | 6.43 |
| 4 | 100/110 | 44 | 10.35 | 0.35 | 4.51 | 6.77 |
| 5 | 100/110 | 47 | 11.75 | 0.375 | 4.73 | 6.9 |
| 6 | 90/95 | 38 | 12.47 | 0.35 | 4.43 | 6.46 |
| 7 | 100/110 | 40 | 11.69 | 0.375 | 5.08 | 7.47 |
| 8 | 90/105 | 45 | 14.86 | 0.35 | 4.6 | 6.65 |
| 9 | 100/110 | 48 | 15.31 | 0.3 | 4.86 | 7.01 |
| 10 | 100/110 | 47 | 14.18 | 0.375 | 4.25 | 6.08 |
| 11 | 100/110 | 37 | 14.16 | 0.375 | 4.77 | 6.89 |
| 12 | 100/110 | 50 | 12.24 | 0.325 | 7.99 | 11.66 |
| 13 | 100/110 | 43 | 12.71 | 0.275 | 4.61 | 6.70 |
| 14 | 100/110 | 50 | 12.23 | 0.400 | 4.13 | 6.04 |
| 15 | 90/105 | 37 | 12.36 | 0.425 | 5.10 | 7.27 |
| 16 | 100/110 | 40 | 10.44 | 0.35 | 6.75 | 9.85 |
| 17 | 100/110 | 54 | | 0.5 | | 8.64 |
| 18 | 100/110 | 46 | 9.66 | 0.35 | 4.66 | 7.08 |
| 19 | 100/110 | 47 | 12.59 | 0.35 | 4.3 | 6.15 |
| 20 | 100/110 | 45 | 12.23 | 0.35 | 4.31 | 6.31 |
| 21 | 90/105 | 46 | 10.51 | 0.35 | 4.62 | 6.91 |
| 22 | 100/110 | 49 | 11.22 | 0.325 | 4.38 | 6.49 |
| Comparative 1 | 100/110 | 60 | | 0.3 | | 10.03 |

EL—exposure latitude;
LER—line-edge roughness;
LWR—line-width roughness

The foregoing description of the invention illustrates and describes the present invention. Additionally, the disclosure shows and describes only certain embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:

1. A photoresist composition comprising a mixture of photoacid generators and a polymer comprising, (i) recurring units of structure (1) and (2)

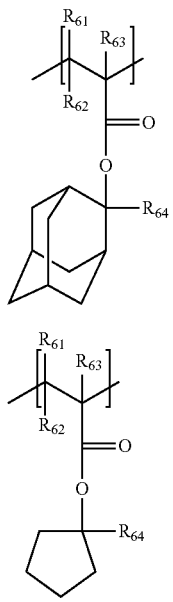

(1)

(2)

where each of $R_{61}$, $R_{62}$, $R_{63}$, are individually selected from hydrogen or $C_{1-4}$ alkyl; and $R_{64}$ is $C_{1-4}$ alkyl; and (ii) one additional recurring unit of structure (10)

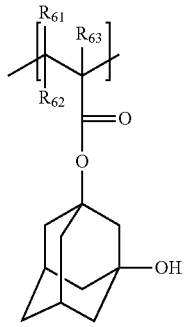

(10)

where each $R_{61}$, $R_{62}$, and $R_{63}$, are individually selected from hydrogen or $C_{1-4}$ alkyl, further where the mixture of photoacid generators comprises at least one of a compound of formula

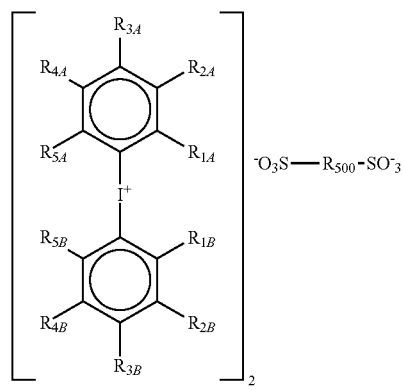

where $R_{1A}$, $R_{1B}$, $R_{2A}$, $R_{2B}$, $R_{3A}$, $R_{3B}$, $R_{4A}$, $R_{4B}$, $R_{5A}$, and $R_{5B}$ are each independently selected from hydrogen, straight alkyl chain and branched alkyl chain, $R_{500}$ is selected from unsubstituted $C_{1-8}$ perfluoroalkyl and substituted $C_{1-8}$ perfluoroalkyl;

at least one of a compound of formula

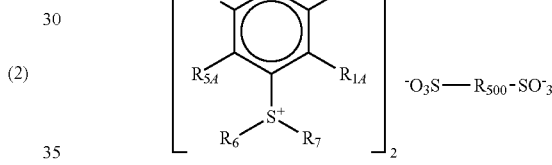

where $R_{1A}$, $R_{2A}$, $R_{3A}$, $R_{4A}$, and $R_{5A}$, are each independently selected from hydrogen, straight alkyl chain and branched alkyl chain, $R_6$ and $R_7$ are each independently selected from aryl and aralkyl, $R_{500}$ is a selected from unsubstituted $C_{1-8}$ perfluoroalkyl and substituted $C_{1-8}$ perfluoroalkyl; and, at least one of a compound selected from the formula

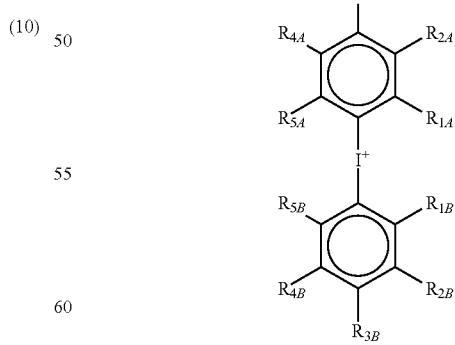

Xi where $R_{1A}$, $R_{1B}$, $R_{2A}$, $R_{2B}$, $R_{3A}$, $R_{3B}$, $R_{4A}$, $R_{4B}$, $R_{5A}$, and $R_{5B}$ are each independently selected from hydrogen, straight alkyl chain and branched alkyl chain, where Xi is selected from $(Rf_1SO_2)_2N^-$,

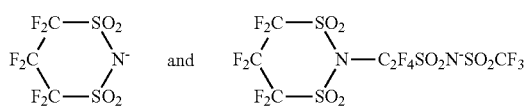

where Rf₁ is selected from perfluorinated alkyl and perfluorinated cycloalkyl, further where the composition comprises at least one base selected from substituted or unsubstituted anilines and at least one base selected from substituted or unsubstituted piperidines and substituted or unsubstituted mono- or diethanolamine.

2. The composition of claim 1 which further comprises at least one photoacid generator.

3. The composition of claim 1 wherein for the polymer, the recurring unit (i) is a mixture of the compound of formula (1) where $R_{61}$ and $R_{62}$ are hydrogen, $R_{63}$ is methyl and $R_{64}$ is ethyl and the compound of formula (2) where $R_{61}$ and $R_{62}$ are hydrogen, $R_{63}$ is methyl and $R_{64}$ is ethyl.

4. The composition of claim 1 wherein the polymer further comprises the unit

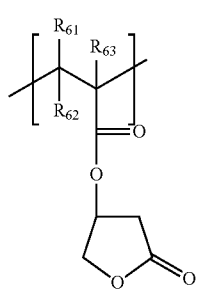
(16)

where $R_{61}$, $R_{62}$, and $R_{63}$, are individually selected from hydrogen or $C_{1-4}$ alkyl.

5. A process for imaging a photoresist comprising the steps of: a) coating a substrate with the photoresist composition of claim 1; b) baking the substrate to substantially remove the solvent; c) image-wise exposing the photoresist coating; d) post-exposure baking the photoresist coating; and e) developing the photoresist coating with an aqueous alkaline solution.

6. A method for producing a microelectronic device by forming an image on a substrate comprising: a) providing a photoresist composition of claim 1; b) coating a suitable substrate with the photoresist composition of step a); and c) heat treating the coated substrate of step b) until substantially all of the photoresist solvent is removed; image-wise exposing the photoresist composition and removing the image-wise exposed areas of such composition with a suitable developer.

7. The composition of claim 1 where the polymer is selected from a group consisting of poly(2-ethyl-2-adamantyl methacrylate-co-ethylcyclopentylmethacrylate-co-2-adamantyloxymethyl methacrylate-co-hydroxy-1-adamantyl acrylate-co-α-gamma-butyrolactone methacrylate), poly(2-ethyl-2-adamantyl methacrylate-co-ethylcyclopentyl-methacrylate-co-hydroxy-1-adamantyl acrylate-co-5-acryloyloxy-2,6-norbornanecarbolactone), (poly(2-ethyl-2-adamantyl methacrylate-co-ethylcyclopentylmethacrylate-co-hydroxy-1-adamantyl acrylate-co-β-gamma-butyrolactone methacrylate), poly(2-ethyl-2-adamantyl methacrylate-co-ethylcyclopentylmethacrylate-co-2-adamantyloxymethyl methacrylate-co-2-adamantyloxylmethyl-methacrylate-co-hydroxy-1-adamantyl acrylate-co-α-gamma-butyrolactone methacrylate), poly(2-ethyl-2-adamantyl methacrylate-co-ethylcyclopentylmethacrylate-co-2-adamantyloxymethyl methacrylate-co-2-oxo-adamantyloxylmethylmethacrylate-co-hydroxy-1-adamantyl acrylate-co-α-gamma-butyrolactone methacrylate), and poly(2-ethyl-2-adamantyl methacrylate-co-ethylcyclopentylmethacrylate-co-2-adamantyloxymethyl methacrylate-co-methylmaveloniclactone methacrylate-hydroxy-1-adamantyl acrylate-co-α-gamma-butyrolactone methacrylate).

* * * * *